(12) United States Patent
Fukushima et al.

(10) Patent No.: US 12,199,113 B2
(45) Date of Patent: Jan. 14, 2025

(54) ELECTROMAGNETIC WAVE DETECTOR AND ELECTROMAGNETIC WAVE DETECTOR ASSEMBLY

(71) Applicant: Mitsubishi Electric Corporation, Tokyo (JP)

(72) Inventors: Shoichiro Fukushima, Tokyo (JP); Masaaki Shimatani, Tokyo (JP); Satoshi Okuda, Tokyo (JP); Shimpei Ogawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 348 days.

(21) Appl. No.: 17/774,482

(22) PCT Filed: Jul. 30, 2020

(86) PCT No.: PCT/JP2020/029339
§ 371 (c)(1),
(2) Date: May 5, 2022

(87) PCT Pub. No.: WO2021/124609
PCT Pub. Date: Jun. 24, 2021

(65) Prior Publication Data
US 2022/0392934 A1    Dec. 8, 2022

(30) Foreign Application Priority Data

Dec. 17, 2019 (JP) .................................. 2019-227413

(51) Int. Cl.
*H01L 27/146* (2006.01)

(52) U.S. Cl.
CPC .. *H01L 27/14607* (2013.01); *H01L 27/14643* (2013.01); *H01L 27/14629* (2013.01)

(58) Field of Classification Search
CPC .......................... H01L 31/10; H01L 27/14607
See application file for complete search history.

(56) References Cited

U.S. PATENT DOCUMENTS

| 2013/0082241 A1 | 4/2013 | Kub et al. |
| 2014/0231752 A1* | 8/2014 | Shin ..................... H10K 85/211 |
| | | 257/29 |

(Continued)

FOREIGN PATENT DOCUMENTS

| JP | 2013-177273 A | 9/2013 |
| JP | 2016-25356 A | 2/2016 |

(Continued)

OTHER PUBLICATIONS

International Search Report and Written Opinion mailed on Oct. 13, 2020, received for PCT Application PCT/JP2020/029339, Filed on Jul. 30, 2020, 13 pages including English Translation.

(Continued)

*Primary Examiner* — Evren Seven
(74) *Attorney, Agent, or Firm* — XSENSUS LLP

(57) ABSTRACT

An electromagnetic wave detector includes: a semiconductor layer in which a step is formed, the semiconductor layer having sensitivity to a detection wavelength; an insulating film disposed on the step and provided with an opening through which a part of the step is exposed; a two-dimensional material layer disposed on the insulating film and the opening, the two-dimensional material layer including a connection region electrically connected to the semiconductor layer in the opening; a first electrode disposed on the insulating film and electrically connected to the two-dimensional material layer; and a second electrode disposed on the semiconductor layer and electrically connected to the first electrode through the connection region of the two-dimensional material layer.

21 Claims, 24 Drawing Sheets

(56) References Cited

U.S. PATENT DOCUMENTS

| | | |
|---|---|---|
| 2015/0243826 A1 | 8/2015 | An et al. |
| 2015/0364545 A1* | 12/2015 | Heo ..................... H01L 29/267 |
| | | 257/24 |
| 2016/0020280 A1* | 1/2016 | Heo ..................... H01L 31/028 |
| | | 257/27 |
| 2019/0051763 A1 | 2/2019 | Shimatani et al. |
| 2020/0264038 A1 | 8/2020 | Shimatani et al. |
| 2020/0395499 A1 | 12/2020 | Ogawa et al. |

FOREIGN PATENT DOCUMENTS

| | | |
|---|---|---|
| WO | 2017/145299 A1 | 8/2017 |
| WO | 2018/173347 A1 | 9/2018 |
| WO | 2019/171622 A1 | 9/2019 |

OTHER PUBLICATIONS

Office Action issued Jun. 26, 2024 in Chinese Patent Application No. 202080085891.9, 15 pages.

Japanese Office Action issued May 23, 2023 in corresponding Japanese Patent Application No. 2021-565327 (with 1 machine-generated English translation), 11 pages.

\* cited by examiner

ELECTROMAGNETIC WAVE DETECTOR AND ELECTROMAGNETIC WAVE DETECTOR ASSEMBLY

CROSS-REFERENCE TO RELATED APPLICATIONS

The present application is based on PCT filing PCT/JP2020/029339, filed Jul. 30, 2020, which claims priority to JP 2019-227413, filed Dec. 17, 2019, the entire contents of each are incorporated herein by reference.

TECHNICAL FIELD

The present disclosure relates to an electromagnetic wave detector and an electromagnetic wave detector assembly.

BACKGROUND ART

Conventionally, graphene having extremely high mobility, which is an example of a two-dimensional material layer, is known as a material of an electromagnetic wave detection layer used in a next-generation electromagnetic wave detector. An absorption rate of graphene is as low as 2.3%. For this reason, a method for increasing sensitivity in the electromagnetic wave detector using graphene has been proposed. For example, in US Patent Application Publication No. 2015/0243826, a detector having the following structure is proposed. That is, in US Patent Application Publication No. 2015/0243826, at least two dielectric layers are provided on an n-type semiconductor layer. A graphene layer is formed on the two dielectric layers and a surface portion of the n-type semiconductor layer located between the two dielectric layers. Source and drain electrodes connected to both ends of the graphene layer are disposed on the dielectric layer. A gate electrode is connected to the n-type semiconductor layer.

In the detector, voltage is applied to the graphene layer as a channel through the source and drain electrodes. As a result, optical carriers generated in the n-type semiconductor layer are amplified to increase the sensitivity of the detector. In addition, when the voltage is applied to the gate electrode and the source electrode or the drain electrode, an off operation is enabled by Schottky connection between the graphene and the n-type semiconductor layer.

CITATION LIST

Patent Literature

PTL 1: US Patent Application Publication No. 2015/0243826

SUMMARY OF INVENTION

Technical Problem

However, in the detector described above, the transistor operation is performed during a high sensitivity operation in which the source-drain voltage is applied to the graphene, so that the off operation of the detector is difficult. During Schottky operation in which the voltage is applied to the gate electrode and the source electrode or the drain electrode, the sensitivity of the detector depends on quantum efficiency of the semiconductor layer. For this reason, sufficient amplification of photocarriers cannot be performed, and it is difficult to increase the sensitivity of the detector. In this way, in the conventional detector using the two-dimensional material layer such as the graphene, both the high sensitivity and the off operation cannot be achieved.

A main object of the present disclosure is to provide an electromagnetic wave detector and an electromagnetic wave detector assembly using the two-dimensional material layer that has high detection sensitivity and is capable of the off operation.

Solution to Problem

An electromagnetic wave detector according to the present disclosure includes: a semiconductor layer in which at least one step is formed, the semiconductor layer having sensitivity to a detection wavelength; an insulating film disposed on the at least one step and provided with at least one opening through which a part of the at least one step is exposed; a two-dimensional material layer disposed on the insulating film and the at least one opening, the two-dimensional material layer including a connection region electrically connected to the semiconductor layer in the at least one opening; a first electrode disposed on the insulating film and electrically connected to the two-dimensional material layer; and a second electrode disposed on the semiconductor layer and electrically connected to the first electrode through the connection region of the two-dimensional material layer.

Advantageous Effects of Invention

According to the present disclosure, it is possible to provide the electromagnetic wave detector and the electromagnetic wave detector assembly using the two-dimensional material layer that has the high detection sensitivity and is capable of the off operation.

DESCRIPTION OF EMBODIMENTS

Figure 1:
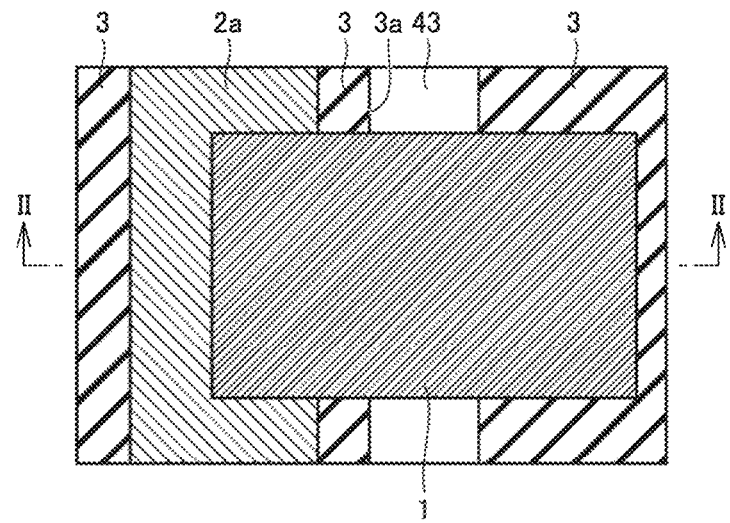
FIG. 1 is a schematic plan view illustrating an electromagnetic wave detector according to a first embodiment.

Hereinafter, embodiments of the present disclosure will be described with reference to the drawings. In the following drawings, the same or corresponding component is designated by the same reference numeral, and the overlapping description will be omitted.

In the following embodiments, the drawings are schematic, and conceptually describe a function or a structure. The present disclosure is not limited to the following embodiments. Unless otherwise specified, a basic constitution of the electromagnetic wave detector is common to all the embodiments. In addition, the components denoted by the same reference numeral are the same as or corresponding to them as described above. This is common in the entire specification.

In the embodiments described below, the electromagnetic wave detector will be described using a constitution in the case of detecting visible light or infrared light, but the present disclosure is not limited thereto. The embodiments described below are also effective as a detector that detects a radio wave such as an X-ray, ultraviolet light, near-infrared light, a terahertz (THz) wave, or a microwave, in addition to the visible light or the infrared light. In the embodiment of the present disclosure, these types of light and radio waves are collectively referred to as an electromagnetic wave.

In the embodiments of the present disclosure, the term of p-type graphene or n-type graphene may be used as the graphene. In the following embodiments, graphene having more holes than graphene in an intrinsic state is referred to as p-type graphene, and graphene having more electrons than graphene in the intrinsic state is referred to as n-type graphene.

In the embodiments of the present disclosure, an n-type or p-type term may be used for a material in contact with graphene that is an example of a two-dimensional material layer. At this point, for example, the n-type material indicates a material having an electron donating property, and the p-type material indicates a material having an electron withdrawing property. In addition, there is a case where a charge bias is observed in the entire molecule, and a case where electrons are dominant is referred to as an n-type and a case where holes are dominant is referred to as a p-type. Any one of an organic substance and an inorganic substance or a mixture thereof can be used as these materials.

In addition, a plasmon resonance phenomenon such as a surface plasmon resonance phenomenon that is an interaction between a metal surface and light, a phenomenon called pseudo surface plasmon resonance in the sense of resonance applied to the metal surface in a region other than a visible light region and the near-infrared light region, or a phenomenon called metamaterial or plasmonic metamaterial in the sense of manipulating a specific wavelength by a structure having a dimension less than or equal to a wavelength are not particularly distinguished by names, but are equally treated in terms of an effect exerted by the phenomenon. At this point, these resonances are referred to as surface plasmon resonance, plasmon resonance, or simply resonance.

In the embodiments described below, graphene is described as an example of the material of the two-dimensional material layer, but the material constituting the two-dimensional material layer is not limited to graphene. For example, a material such as transition metal dichalcogenide (TMD), black phosphorus, silicene (two-dimensional honeycomb structure by silicon atoms), and germanene (two-dimensional honeycomb structure by germanium atoms) can be applied as a material of the two-dimensional material layer. An example of the transition metal dichalcogenide includes transition metal dichalcogenide such as $MoS_2$, $WS_2$, and $WSe_2$.

These materials have a structure similar to that of graphene, and are materials capable of arranging atoms in a monolayer in a two-dimensional plane. Accordingly, even when these materials are applied to the two-dimensional material layer, the same action and effect as the case where graphene is applied to the two-dimensional material layer can be obtained.

First Embodiment

<Constitution of Electromagnetic Wave Detector>

Figure 2:
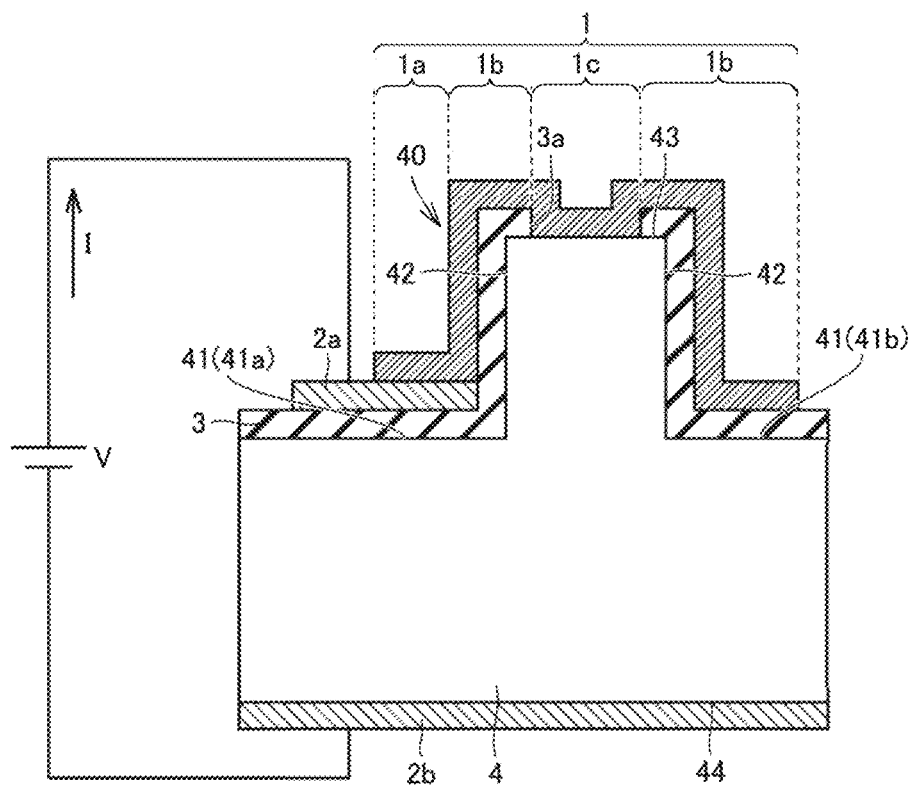
FIG. 2 is a sectional view taken along a line II-II in FIG. 1.
Figure 3:
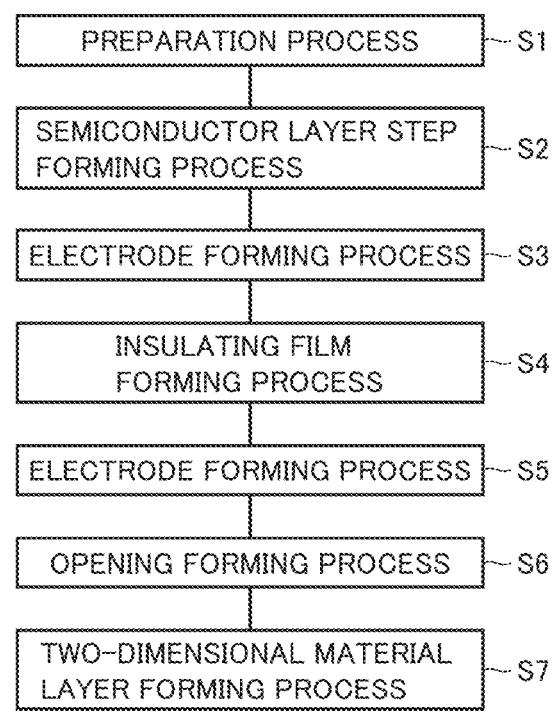
FIG. 3 is a flowchart illustrating a method for manufacturing the electromagnetic wave detector of the first embodiment.

FIG. 1 is a schematic plan view illustrating an electromagnetic wave detector according to a first embodiment. FIG. 2 is a schematic sectional view taken along a line IB-IB in FIG. 1. FIG. 3 also illustrates a typical electric connection of an electromagnetic wave detector 100.

As illustrated in FIGS. 1 and 2, the electromagnetic wave detector of the first embodiment mainly includes a semiconductor layer 4 in which a step is formed, an insulating film 3, a two-dimensional material layer 1, a first electrode 2a, and a second electrode 2b.

Semiconductor layer 4 has sensitivity to a predetermined detection wavelength from among the electromagnetic waves described above. That is, semiconductor layer 4 has a first conductive side, and is provided such that photocarriers are generated in semiconductor layer 4 when the electromagnetic wave having the predetermined detection wavelength is incident on semiconductor layer 4. A semiconductor material constituting semiconductor layer 4 can be arbitrarily selected according to the detection wavelength to have sensitivity.

For example, in a case where the detection wavelength range is greater than or equal to 0.1 μm and less than or equal to 0.6 μm, gallium phosphide (GaP) can be selected as the semiconductor material constituting semiconductor layer 4. When the detection wavelength range is greater than or equal to 0.2 μm and less than or equal to 1.1 μm, silicon (Si) can be selected as the semiconductor material. When the detection wavelength range is greater than or equal to 0.8 μm and less than or equal to 1.8 μm, germanium (Ge) can be selected as the semiconductor material. When the detection wavelength range is greater than or equal to 0.7 μm and less than or equal to 2.55 μm, indium gallium arsenide (InGaAs) can be selected as the semiconductor material. When the detection wavelength range is greater than or equal to 1 μm and less than or equal to 3.1 μm, indium arsenide (InAs) can be selected as the semiconductor material. When the detection wavelength range is greater than or equal to 1 μm and less than or equal to 5.4 μm, indium antimonide (InSb) can be selected as the semiconductor material. When the detection wavelength range is greater than or equal to 2 μm and less than or equal to 16 μm, mercury cadmium telluride (HgCdTe) can be selected as the semiconductor material.

The semiconductor material constituting semiconductor layer 4 is not limited to the above. The material constituting semiconductor layer 4 may be a simple substance of a compound semiconductor such as Si, Ge, a III-V group semiconductor, or a II-V group semiconductor, a substrate including HgCdTe, InSb, lead-selenium (PbSe), lead-sulfur (PbS), cadmium-sulfur (CdS), gallium nitride (GaN), silicon carbide (SiC), gallium phosphide (GaP), InGaAs, InAs, a quantum well, or a quantum dot, or a material such as a type II superlattice or a combination thereof. When the material constituting semiconductor layer 4 is a combination of the above-described semiconductor materials, the electromagnetic wave detector including semiconductor layer 4 can detect multiple wavelengths.

One step 40 is formed in semiconductor layer 4. Step 40 has a protrusion shape, in which a number of tops 43 is smaller than a number of bottoms 41 and a total area of bottom 41 is larger than the total area of top 43. Step 40 includes two bottoms 41, one top 43, and two side portions 42. Top 43 protrudes with respect to two bottoms 41 in a thickness direction of semiconductor layer 4. Each of two side portions 42 is positioned between bottom 41 and top 43. For example, as illustrated in FIG. 1, top 43 has a longitudinal direction and a lateral direction. Both ends of top 43 in the lateral direction are connected to side portion 42. Each side portion 42 includes an upper end connected to one end of top 43 in the lateral direction and a lower end connected to one end of bottom 41 in the lateral direction. Each bottom 41 includes the one end connected to the lower end of the side portion 42 and the other end disposed on the opposite side to the one end in the lateral direction. As illustrated in FIG. 2, a width of one bottom 41a of the two bottoms 41 in the lateral direction is larger than a width of the other bottom 41b in the lateral direction.

For example, a back surface 44 of semiconductor layer 4 located on the opposite side of step 40 in the thickness direction of semiconductor layer 4 is constituted as a flat surface.

For example, semiconductor layer 4 is prepared by doping a silicon substrate on which step 40 is formed with an impurity.

Insulating film 3 is disposed on semiconductor layer 4. An opening 3a through which a part of step 40 is exposed is provided in insulating film 3. For example, insulating film 3 is disposed on entirety of two bottoms 41 and two side portions 42 of step 40 and on a part of top 43. For example, opening 3a exposes a part of top 43. For example, opening 3a exposes a central portion of top 43 in the lateral direction. A distance between opening 3a and one end of top 43 in the lateral direction is equal to a distance between opening 3a and the other end of top 43 in the lateral direction. For example, the distance between opening 3a and one end of top 43 in the lateral direction and the distance between opening 3a and the other end of top 43 in the lateral direction are constant in the longitudinal direction. For example, opening 3a extends from one end to the other end of top 43 in the longitudinal direction. For example, opening 3a has the longitudinal direction and the lateral direction. For example, the longitudinal direction of opening 3a is along the longitudinal direction of top 43. The lateral direction of opening 3a is along the lateral direction of top 43.

For example, the material constituting insulating film 3 is silicon oxide ($SiO_2$) such as none-doped silicate glass (NSG), phospho silicate glass (PSG), or boro-phospho silicate glass (BPSG), tetraethyl orthosilicate ($Si(OC_2H_5)_4$), silicon nitride ($Si_3N_4$), hafnium oxide ($HfO_2$), aluminum oxide ($Al_2O_3$), nickel oxide (NiO), tetraethyl orthosilicate (TEOS), barium titanate ($BaTiO_3$), lead zirconate titanate ($PbZrTiO_3$), strontium bismuth tantalate ($SrBi_2Ta_2O_9$), bismuth ferrite ($BFO:BiFeO_3$), lithium niobate ($LiNbO_3$), lithium tantalate ($LiTaO_3$), boron nitride (BN), or a siloxane-based polymer material. Because the BN has an atomic arrangement similar to that of the graphene, even when the BN comes into contact with two-dimensional material layer 1 made of the graphene, the BN does not adversely affect electron mobility of two-dimensional material layer 1. For this reason, the BN is suitable for insulating film 3 as a base film disposed under two-dimensional material layer 1.

A thickness T of insulating film 3 is not particularly limited as long as two-dimensional material layer 1 and first electrode 2a are electrically insulated from semiconductor layer 4, and as long as a tunnel current is prevented from being generated between two-dimensional material layer 1 and first electrode 2a and semiconductor layer 4. The smaller thickness T of insulating film 3, the larger a degree of electric field change of two-dimensional material layer 1 due to the photocarriers generated at an interface between insulating film 3 and semiconductor layer 4. For this reason, thickness T of insulating film 3 is desirably as thin as possible. The electric field change of two-dimensional material layer 1 caused by the photocarriers generated at the interface between insulating film 3 and semiconductor layer 4 is called photogating effect, and the details thereof will be described later.

First electrode 2a is disposed on insulating film 3. First electrode 2a is disposed at a position away from opening 3a. Preferably, first electrode 2a is disposed on bottom 41a. First electrode 2a is electrically connected to two-dimensional material layer 1.

Second electrode 2b is disposed on semiconductor layer 4. Second electrode 2b is electrically connected to first electrode 2a through a later-described region 1c (connection region) of two-dimensional material layer 1. For example, second electrode 2b is disposed on entire back surface 44 of semiconductor layer 4 located on the opposite side of step 40 in the thickness direction of semiconductor layer 4. In this case, in the electromagnetic wave incident on the electromagnetic wave detector from the side of step 40, the electromagnetic wave that is transmitted through semiconductor layer 4 to reach back surface 44 is reflected by second electrode 2b. Accordingly, the absorption rate of the electromagnetic wave of semiconductor layer 4 is increased.

As the material constituting first electrode 2a and second electrode 2b, any material can be used as long as the material is a conductor. For example, the material constituting first electrode 2a and second electrode 2b contains at least one selected from the group consisting of gold (Au), silver (Ag), copper (Cu), aluminum (Al), nickel (Ni), chromium (Cr), and palladium (Pd). An adhesion layer (not illustrated) that enhances adhesion between first electrode 2a and insulating film 3 may be formed between first electrode 2a and insulating film 3. An adhesion layer (not illustrated) that enhances adhesion between second electrode 2b and semiconductor layer 4 may be formed between second electrode 2b and semiconductor layer 4. For example, the material constituting the adhesion layer includes a metal material such as chromium (Cr) or titanium (Ti).

Although first electrode 2a in FIG. 2 is formed below two-dimensional material layer 1, first electrode 2a may be formed above two-dimensional material layer 1. In addition, second electrode 2b in FIG. 2 is disposed in entire back surface 44 of semiconductor layer 4, but the present disclosure is not limited thereto. For example, second electrode 2b may be disposed on a portion exposed from insulating film 3 on bottom 41 or side portion 42 of semiconductor layer 4, and directly connected to the portion. When second electrode 2b is not disposed on back surface 44, the electromagnetic wave irradiated from the side of back surface 44 can be detected.

Two-dimensional material layer 1 is disposed on insulating film 3 and opening 3a. Two-dimensional material layer 1 extends from the inside of opening 3a onto insulating film 3. Two-dimensional material layer 1 is electrically connected to first electrode 2a on insulating film 3, and electrically connected to semiconductor layer 4 inside opening 3a. For example, two-dimensional material layer 1 is disposed on a part of one bottom 41a, one side portion 42, top 43, the other side portion 42, and a part of the other bottom 41b.

From a different point of view, two-dimensional material layer 1 includes a region 1a electrically connected to first electrode 2a, region 1c (region located inside opening 3a) electrically connected to semiconductor layer 4 inside opening 3a, and a region 1b facing semiconductor layer 4 through insulating film 3. For example, region 1a is directly connected to first electrode 2a. For example, region 1c is directly connected to semiconductor layer 4. Region 1a is disposed above a part of bottom 41. Region 1c is disposed on a part of top 43. Region 1b is disposed on the rest of top 43 and the two side portions 42. A part of region 1b is disposed on one side portion 42, and connects region 1a and region 1c. The other part of region 1b is disposed on the other side portion 42. The other part of region 1b extends from region 1c to a portion of insulating film 3 opposite to the side where first electrode 2a is located when viewed from opening 3a of insulating film 3.

For example, two-dimensional material layer 1 is monolayer graphene. The monolayer graphene is a monoatomic layer of a two-dimensional carbon crystal. The monolayer graphene has carbon atoms in each chain arranged in a hexagonal shape. Because the graphene has higher carrier mobility than semiconductor materials such as Si used in conventional electronic devices, electromagnetic wave detector 100 has an effect of improving an optical response speed.

Two-dimensional material layer 1 may be a laminated body (hereinafter, referred to as multilayer graphene) of at least two layers of graphene. A direction of a lattice vector in a hexagonal lattice of each graphene in the multilayer graphene may not be matched or may be different. In addition, the direction of the lattice vector in the hexagonal lattice of each graphene in the multilayer graphene may be completely matched with each other. In the multilayer graphene, a size of a band gap of the multilayer graphene can be adjusted by the number of layers of the graphene. Accordingly, by adjusting the size of the band gap of the multilayer graphene according to the detection wavelength, two-dimensional material layer 1 can act as an electromagnetic wave absorbing layer, and need of an optical filter can be eliminated. Thus, the number of optical components can be reduced, and a loss of incident light due to passage through the optical filter can be reduced.

When the material constituting two-dimensional material layer 1 contains the graphene, the graphene may be constituted as a nanoribbon (hereinafter, referred to as a graphene nanoribbon) obtained by cutting a graphene sheet with a width on the order of nanometers. Two-dimensional material layer 1 may be constituted as the graphene nanoribbon alone, a laminated body of a plurality of graphene nanoribbons, or a structure in which graphene nanoribbons are periodically arranged on a plane.

When two-dimensional material layer 1 includes the periodically arranged graphene nanoribbons (graphene metamaterials), plasmon resonance is generated in two-dimensional material layer 1, and the electromagnetic wave detection sensitivity of two-dimensional material layer 1 is improved.

When the material constituting two-dimensional material layer 1 contains the graphene, the graphene may be undoped graphene doped with the impurity. The graphene may be graphene doped with a p-type or n-type impurity.

For example, the material constituting two-dimensional material layer 1 is uniform in each of region 1a, region 1b, and region 1c. The material constituting two-dimensional material layer 1 may be different in each of region 1a, region 1b, and region 1c.

For example, the material constituting region 1a is the multilayer graphene. Region 1a is doped with carriers from first electrode 2a. For example, when the material of first electrode 2a is gold (Au), a hole is doped in region 1a of two-dimensional material layer 1 due to the difference in work function between the graphene and Au. When the electromagnetic wave detector is driven in this state, the carrier mobility flowing in a channel region of two-dimensional material layer 1 decreases due to the influence of the hole doped from first electrode 2a to region 1a, and a contact resistance between two-dimensional material layer 1 and first electrode 2a increases. Due to the increase in the contact resistance, the mobility of electrons (carriers) due to the electric field effect in the electromagnetic wave detector decreases, and the performance of the electromagnetic wave detector may decrease. In particular, when the material constituting region 1a is the monolayer graphene, the doping amount of the carrier injected from first electrode 2a increases as compared with the case where the material constituting region 1a is the multilayer graphene, and as a result, the decrease in the carrier mobility in the electromagnetic wave detector becomes conspicuous. For this reason, from the viewpoint of preventing the above-described decrease in the carrier mobility to improve the performance of the electromagnetic wave detector, the material constituting region 1a is preferably the multilayer graphene rather than the monolayer graphene.

For example, the material constituting region 1b is the monolayer graphene. Region 1b acts as what is called a channel region. The mobility of electrons in the monolayer graphene is higher than that of electrons in the multilayer graphene. For this reason, from the viewpoint of enhancing the mobility of electrons in region 1b to improve the performance of the electromagnetic wave detector, the material constituting region 1b is preferably monolayer graphene rather than multilayer graphene.

That is, the multilayer graphene is used as the material constituting region 1a and the monolayer graphene is used as the material constituting region 1b, so that the mobility of electrons in region 1b can be increased while the increase in the contact resistance between region 1a and first electrode 2a is prevented, and the performance of the electromagnetic wave detector can be improved.

<Method for Manufacturing Electromagnetic Wave Detector>

FIG. 3 is a flowchart illustrating a method for manufacturing the electromagnetic wave detector of the first embodiment. With reference to FIG. 3, the method for manufacturing the electromagnetic wave detector in FIGS. 1 and 2 will be described.

First, a preparation process (S1) in FIG. 3 is performed. In this process (S1), a flat semiconductor substrate is prepared. The semiconductor material constituting the semiconductor substrate is a semiconductor material having the sensitivity to a predetermined detection wavelength.

Subsequently, a semiconductor layer step forming process (S2) is performed. In this process (S2), first, a protective film is formed on a region where top 43 of step 40 is formed in the semiconductor substrate. For example, the protective film is a resist. In the protective film, for example, the opening exposing a region where bottom 41 is formed is formed by photolithography or electron beam (EB) drawing. Subsequently, the semiconductor substrate is etched using the protective film as an etching mask. An etching technique may be selected from one of wet etching using a chemical solution such as acid or alkali and dry etching using reactive species in plasma. After the etching, the protective film is removed. In this way, semiconductor layer 4 including step 40 is formed from the semiconductor substrate.

Subsequently, an electrode forming process (S3) is performed. In this process (S3), second electrode 2b is formed on the back surface of semiconductor layer 4. Specifically, a metal film is formed after the protective film is formed on step 40 of semiconductor layer 4. Before second electrode 2b is formed, the above-described adhesion layer may be previously formed in a region connected to second electrode 2b in semiconductor layer 4 in order to improve the adhesion between semiconductor layer 4 and second electrode 2b.

Subsequently, an insulating film forming process (S4) is performed. In this process (S4), insulating film 3 is formed on step 40 of semiconductor layer 4. Preferably, insulating film 3 is formed so as to be in close contact with the whole of bottom 41, side portion 42, and top 43 of step 40 without any gap. The method for forming insulating film 3 is not particularly limited. Insulating film 3 can be formed by thermally oxidizing the surface of semiconductor layer 4 when the material constituting semiconductor layer 4 is Si while the material constituting insulating film 3 is $SiO_2$. The method for forming insulating film 3 may be a chemical vapor deposition (CVD) method or a sputtering method.

In order to prevent damage and contamination of semiconductor layer 4 due to the etching in the opening forming process (S6) described later, a barrier film may be formed between semiconductor layer 4 and insulating film 3 immediately before the insulating film forming process (S4). The material constituting the barrier film may be a material having higher resistance to the etchant used in the opening forming process (S6) than the material constituting insulating film 3 (a material having a lower etching rate), and for example, is silicon nitride (SiN), aluminum oxide ($Al_2O_3$), or graphene.

Subsequently, an electrode forming process (S5) is performed. In this process (S5), first electrode 2a is formed on insulating film 3. Before first electrode 2a is formed, in order to improve the adhesion between insulating film 3 and first electrode 2a, the above-described adhesion layer may be previously formed in the region of insulating film 3 connected to first electrode 2a.

For example, the following process can be used as the method for forming first electrode 2a. First, a resist mask is formed on the surface of insulating film 3 using photolithography, EB drawing, or the like. In the resist mask, the opening is formed in a region where first electrode 2a is formed. Then, a film of metal or the like that becomes first electrode 2a is formed on the resist mask. The film can be formed by a vapor deposition method, a sputtering method, or the like. At this time, the film is formed so as to extend from the inside of the opening of the resist mask to the upper surface of the resist mask. Then, the resist mask is removed together with a part of the film, so that another part of the film disposed in the opening of the resist mask remains on the surface of insulating film 3 to become first electrode 2a. The method described above is generally called lift-off.

Another method may be used as the method for forming first electrode 2a. For example, first the film such as a metal film that becomes first electrode 2a is formed on the surface of insulating film 3. Then, the resist mask is formed on the film by a photolithography method. The resist mask is formed so as to cover the region where first electrode 2a is formed, but is not formed in the region other than the region where first electrode 2a is formed. Then, the film is partially removed using the resist mask as the mask by wet etching or dry etching. As a result, a part of the film remains under the resist mask. A part of the film becomes first electrode 2a. Then, the resist mask is removed. In this manner, first electrode 2a may be formed.

Subsequently, an opening forming process (S6) is performed. In this process (S6), opening 3a is formed in insulating film 3. Specifically, the resist mask is formed on insulating film 3 by photolithography or EB pattern writing. In the resist mask, the opening is formed in the region where opening 3a of insulating film 3 is formed.

Then, insulating film 3 is etched using the resist mask as an etching mask. The etching method may be arbitrarily selected from either the wet etching or the dry etching. After the etching, the resist mask is removed. In this manner, opening 3a is formed in insulating film 3. The process (S6) may be performed before the process (S5).

Subsequently, a two-dimensional material layer forming process (S7) is performed. In this process (S7), two-dimensional material layer 1 is formed on step 40. Two-dimensional material layer 1 is formed so as to cover the whole of first electrode 2a, insulating film 3, and semiconductor layer 4 exposed inside opening 3a of insulating film 3. The method for forming two-dimensional material layer 1 is not particularly limited. For example, two-dimensional material layer 1 may be formed by epitaxial growth, or formed by a screen printing method. In addition, two-dimensional material layer 1 may be formed by transferring and bonding a two-dimensional material film formed previously by a CVD method onto step 40, or formed by transferring and bonding a film-like two-dimensional material film peeled off by mechanical peeling or the like onto step 40.

Then, the resist mask is formed on two-dimensional material layer 1 by photolithography or EB drawing. The resist mask is formed so as to cover the region where two-dimensional material layer 1 is formed and to expose other regions. Then, two-dimensional material layer 1 is etched using the resist mask as the mask. For example, the etching method is dry etching using oxygen plasma. Then, the resist mask is removed. Thus, two-dimensional material layer 1 in FIGS. 1 and 2 is formed.

Through the above processes (S1 to S7), the electromagnetic wave detector in FIGS. 1 and 3 is manufactured. In the manufacturing method described above, two-dimensional material layer 1 is formed on first electrode 2a. However, two-dimensional material layer 1 may be previously formed on insulating film 3, and first electrode 2a may be formed so as to overlap a part of two-dimensional material layer 1. However, in the case of using this structure, attention should be paid so as not to cause process damage to two-dimensional material layer 1 during the forming of first electrode 2a. For example, it is conceivable to form first electrode 2a while the region other than the region formed by overlapping first electrode 2a in two-dimensional material layer 1 is previously covered with the protective film or the like.

<Operation Principle>

An operation principle of the electromagnetic wave detector of the first embodiment will be described.

As illustrated in FIG. 2, a power supply circuit (not illustrated) is electrically connected between first electrode 2a and second electrode 2b, and a voltage V is applied between first electrode 2a and second electrode 2b. Thus, a current path in which first electrode 2a, two-dimensional material layer 1, semiconductor layer 4, and second electrode 2b are sequentially connected in series is formed inside the electromagnetic wave detector, and current I flows through two-dimensional material layer 1. An ammeter (not illustrated) is installed in the power supply circuit to monitor current I flowing through two-dimensional material layer 1. In this way, the electromagnetic wave detector can detect the electromagnetic wave. The positive and negative voltages are selected according to a conductivity type (doping type) of semiconductor layer 4. The positive voltage is applied to first electrode 2a when the conductivity type is a p-type, and the negative voltage is applied to first electrode 2a when the conductivity type is an n-type.

In the above state, when the electromagnetic wave having a wavelength at which semiconductor layer 4 has the sensitivity is incident on semiconductor layer 4, the photocarriers are generated inside semiconductor layer 4. At this time, the photocarriers generated in semiconductor layer 4 in a vicinity of opening 3a are injected into region 1c of two-dimensional material layer 1, and cause the change in current I through region 1b and the region. Hereinafter, a current component that causes the change in current I due to electromagnetic wave irradiation is referred to as photocurrent.

Furthermore, because the voltage is applied to semiconductor layer 4, a depletion layer is formed at the interface between semiconductor layer 4 and insulating film 3. The depletion layer is widely formed on interface between bottom 41, side portion 42, and top 43 of step 40 and insulating film 3. The photocarriers are also generated in the depletion layer when the electromagnetic wave having the wavelength at which semiconductor layer 4 has the sensitivity is incident on semiconductor layer 4. The photocarriers generated in the depletion layer give an electric field effect to region 1b of two-dimensional material layer 1 through insulating film 3. As a result, the resistance value of region 1b of two-dimensional material layer 1 changes, and current I flowing through two-dimensional material layer 1 changes. As described above, the electric field effect derived from the light irradiation is applied to region 1b, whereby the electrical characteristic of two-dimensional material layer 1 changes. The photogating effect described above is caused in this way.

The change in current I is detected through first electrode 2a electrically connected to region 1a of two-dimensional material layer 1. Thus, the electromagnetic wave with which the electromagnetic wave detector is irradiated can be detected.

At this point, the electromagnetic wave detector of the first embodiment is not limited to the constitution detecting the change in current in two-dimensional material layer 1 as described above, but for example, a constant current may be caused to flow between first electrode 2a and second electrode 2b, and the change in voltage V between first electrode 2a and second electrode 2b (that is, the change in the voltage value in two-dimensional material layer 1) may be detected.

Subsequently, a specific operation of the electromagnetic wave detector in FIGS. 1 and 2 will be described. At this point, the case where the material constituting two-dimensional material layer 1 is the monolayer graphene, the material constituting first electrode 2a and second electrode 2b is Au, the material constituting insulating film 3 is $Al_2O_3$, and the material constituting semiconductor layer 4 is n-type InSb will be described.

The n-type InSb has the sensitivity to the electromagnetic wave greater than or equal to 1 μm and less than or equal to 5.4 μm. Therefore, when the electromagnetic wave greater than or equal to 1 μm and less than or equal to 5.4 μm is incident on semiconductor layer 4, the photocarriers are generated in semiconductor layer 4. The photocarriers generated in semiconductor layer 4 in the vicinity of opening 3a are injected into the monolayer graphene in region 1c to cause the change in current I.

Furthermore, when the positive voltage is applied to second electrode 2b or the negative voltage is applied to first electrode 2a so as to have a reverse bias with respect to semiconductor layer 4, the electrons in semiconductor layer 4 are attracted to second electrode 2b, and the holes as minority carriers are attracted toward the side of insulating film 3. As a result, the depletion layer is formed at the interface between semiconductor layer 4 and insulating film 3. The photocarriers generated in the depletion layer generate the photo gate effect as described above, give the electric field effect to the monolayer graphene constituting region 1b, and change the mobility of the monolayer graphene constituting region 1b. The magnitude of this field effect correlates with the amount of photocarriers generated in the depletion layer. That is, when the electromagnetic wave greater than or equal to 1 μm and less than or equal to 5.4 μm is incident on the n-type InSb, the photocarriers generated by the n-type InSb are injected into the monolayer graphene constituting region 1c, whereby the photo gate effect is given to the monolayer graphene constituting region 1b while the photocurrent is generated. As a result, the photocurrent is amplified in region 1b.

Because the photogating effect does not directly enhance the quantum efficiency of the photoelectric conversion material but increases the current change due to the incidence of the electromagnetic wave, the quantum efficiency equivalently calculated from the differential current due to the incidence of the electromagnetic wave can exceed 100%.

For this reason, the amount of change in current I when the electromagnetic wave is incident on the electromagnetic wave detector of the first embodiment is larger than the amount of change in the current when the electromagnetic wave is incident on the conventional electromagnetic wave detector that is not provided with region 1b and does not exhibit the photogating effect. Accordingly, the electromagnetic wave detector of the first embodiment has higher sensitivity than the conventional electromagnetic wave detector.

The above-described photogating effect increases when region 1b of two-dimensional material layer 1 subjected to the electric field effect is wider, and the more sensitive electromagnetic wave detection becomes possible. Because two-dimensional material layer 1 is formed of a monatomic layer or a monomolecular layer, the film can be formed along the structural surface of the electromagnetic wave detector. Two-dimensional material layer 1 in the electromagnetic wave detector of the first embodiment is disposed on bottom 41, side portion 42, and top 43 of step 40, and region 1b thereof is disposed on a part of side portion 42 and top 43. For this reason, when comparing the electromagnetic wave detector of the first embodiment in which an occupation area of region 1b in FIG. 1 (that is, the occupation area of region 1b in a plan view) is provided equal and the electromagnetic wave detector as the comparative example in which the two-dimensional material layer 1 is not disposed on step 40, region 1b of the electromagnetic wave detector of the first embodiment is wider than region 1b that can be formed in the comparative example. As a result, the photogating effect exhibited in the electromagnetic wave detector of the first embodiment is enhanced as compared with the photogating effect exhibited in the comparative example. As a result, the electromagnetic wave detector of the first embodiment has higher detection sensitivity than the electromagnetic wave detector of the comparative example.

From a different point of view, the occupation area of region 1b required to implement the specific detection sensitivity in the electromagnetic wave detector of the first embodiment is smaller than the occupation area of region 1b required to implement the specific detection sensitivity in the electromagnetic wave detector of the comparative example. Accordingly, the electromagnetic wave detector of the first embodiment can achieve area saving as compared with the electromagnetic wave detector of the comparative example. As a result, the electromagnetic wave detector of the first embodiment is suitable for an image sensor in which the electromagnetic wave detectors are arranged at high density.

In particular, the electromagnetic wave detector of the first embodiment is provided such that the portion connecting between region 1c and the region 1a in region 1b becomes sufficiently long. Specifically, region 1b is disposed on the entire one side portion 42 connecting bottom 41a and top 43 on at least step 40. For this reason, in the electromagnetic wave detector of the first embodiment, the length of the portion connecting between region 1c and region 1a in region 1b is longer than that of the electromagnetic wave detector in which region 1c is disposed on one side portion 42 connecting between bottom 41a and top 43. As a result, in the electromagnetic wave detector of the first embodiment, as compared with the above-described electromagnetic wave detector, the region where the photocarriers injected from semiconductor layer 4 into two-dimensional material layer 1 at opening 3a at the time of incidence of the electromagnetic wave are affected by the change in the electric field of two-dimensional material layer 1 due to the photogating effect is widened, so that the degree of photocurrent change is increased, and the more highly sensitive electromagnetic wave detection becomes possible.

Even in two-dimensional material layer 1 outside the photocarrier path between opening 3a and first electrode 2a, when there is the region installed on semiconductor layer 4 on which the electromagnetic wave is incident through insulating film 3, the region is affected by the electric field change due to the photogating effect, and indirectly contributes to the modulation of the photocarrier, which is significant for increasing the sensitivity of the electromagnetic wave detector.

In addition, because two-dimensional material layer 1 and semiconductor layer 4 are electrically connected to each other at opening 3a, current I can be made zero by adjusting voltage V. That is, current I becomes zero during no light irradiation, and only the current derived from the photocarrier injected into two-dimensional material layer 1 is changed by the photogating effect during light irradiation and then detected as current I. Accordingly, the electromagnetic wave detector of the first embodiment can perform the off operation.

For example, when two-dimensional material layer 1 is monolayer graphene, the thickness of two-dimensional material layer 1 is as thin as by one atomic layer. In addition, the carrier mobility in the monolayer graphene is larger than that of the conventional semiconductor material. For this reason, in two-dimensional material layer 1, a large current change is generated with respect to a slight potential change as compared with the conventional semiconductor material. For example, the current change amount caused by the potential change applied to two-dimensional material layer 1 by the electric field change in semiconductor layer 4 is larger than the current change amount in the normal semiconductor. Specifically, when calculated from the mobility and thickness of electrons in two-dimensional material layer 1, the current change amount in two-dimensional material layer 1 is about several hundred times to several thousand times the current change amount in the normal semiconductor. Accordingly, the electromagnetic wave detector of the first embodiment can detect the electromagnetic wave with higher sensitivity than the electromagnetic wave detector that detects only the photocarriers generated in semiconductor layer 4.

In the electromagnetic wave detector of the first embodiment, in addition to the photocurrent generated in semiconductor layer 4 with the light irradiation, the photocurrent due to photoelectric conversion efficiency of two-dimensional material layer 1 is also generated. For this reason, in the electromagnetic wave detector of the first embodiment, in addition to the current generated in semiconductor layer 4 by the incidence of the electromagnetic wave and the current associated with the photogating effect, the photocurrent due to the original photoelectric conversion efficiency of two-dimensional material layer 1 can also be detected.

As described above, the electromagnetic wave detector of the first embodiment has higher detection sensitivity than the conventional electromagnetic wave detector and the electromagnetic wave detector of the comparative example and can perform the off operation. Furthermore, the electromagnetic wave detector of the first embodiment achieves the area saving as compared with the conventional electromagnetic wave detector and the electromagnetic wave detector of the comparative example.

MODIFICATIONS

Figure 4:
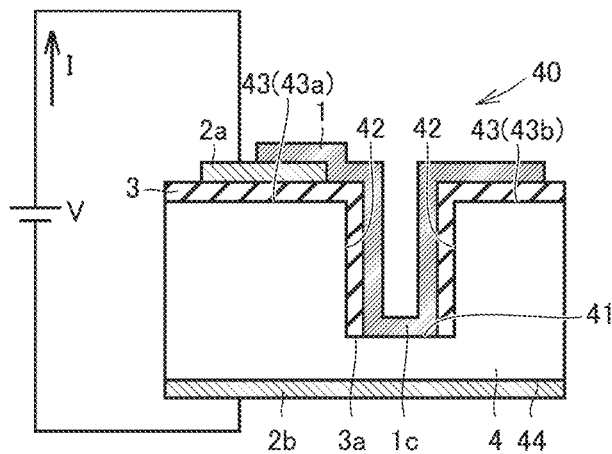
FIG. 4 is a sectional view illustrating a first modification of the electromagnetic wave detector of the first embodiment.
Figure 5:
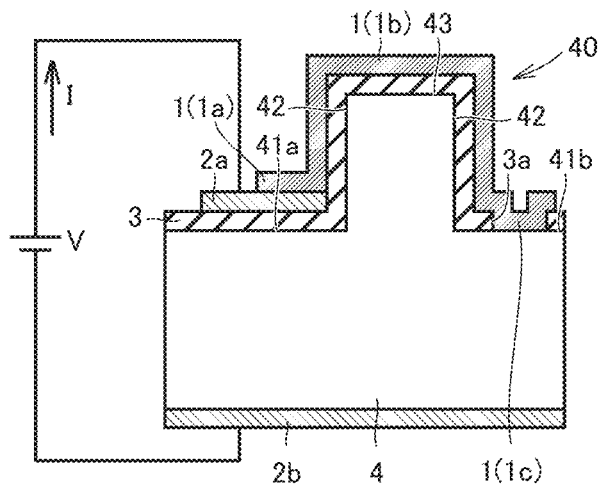
FIG. 5 is a sectional view illustrating a second modification of the electromagnetic wave detector of the first embodiment.
Figure 6:
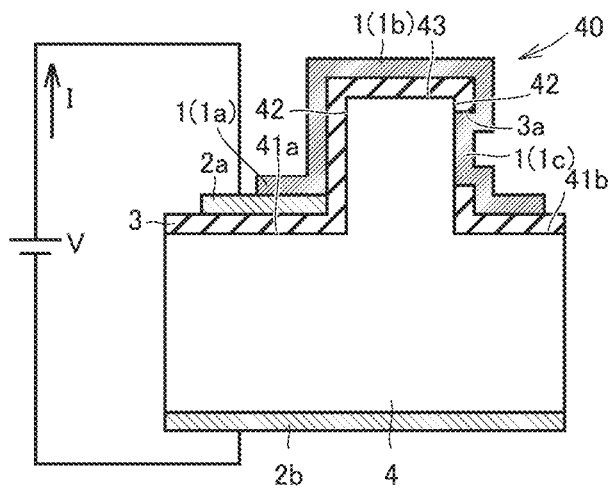
FIG. 6 is a sectional view illustrating a third modification of the electromagnetic wave detector of the first embodiment.

Each of electromagnetic wave detectors in FIGS. 4, 5, and 6 basically has the same configuration as the electromagnetic wave detector in FIG. 2, but a relative positional relationship between step 40 and opening 3a of insulating film 3 is different from that of the electromagnetic wave detector in FIG. 2.

First Modification

In an electromagnetic wave detector according to a first modification in FIG. 4, step 40 has a recess shape, in which the number of tops 43 is larger than the number of bottoms 41 and the total area of bottom 41 is smaller than the total area of top 43. One step 40 includes one bottom 41, two tops 43, and two side portions 42. Bottom 41 is recessed with respect to two tops 43 in the thickness direction of semiconductor layer 4. Each of two side portions 42 is positioned between bottom 41 and top 43.

For example, insulating film 3 is disposed on the entirety of two tops 43 and two side portions 42 of step 40 and on a part of bottom 41. For example, opening 3a exposes a part of bottom 41. For example, opening 3a exposes the central portion of bottom 41 in the lateral direction. The distance between opening 3a and one end of bottom 41 in the lateral direction is equal to the distance between opening 3a and the other end of bottom 41 in the lateral direction. For example, the distance between opening 3a and one end of bottom 41 in the lateral direction and the distance between opening 3a and the other end of bottom 41 in the lateral direction are constant in the longitudinal direction. For example, opening 3a extends from one end to the other end of bottom 41 in the longitudinal direction. For example, opening 3a has the longitudinal direction and the lateral direction. For example, the longitudinal direction of opening 3a is along the longitudinal direction of bottom 41. The lateral direction of opening 3a is along the lateral direction of bottom 41.

First electrode 2a is disposed on one top 43a of two tops 43 in the lateral direction. For example, two-dimensional material layer 1 is disposed on a part of one top 43a, one side portion 42, bottom 41, the other side portion 42, and a part of the other top 43b. In two-dimensional material layer 1 of FIG. 4, region 1c electrically connected to semiconductor layer 4 is disposed on bottom 41.

The distance between region 1c and second electrode 2b in FIG. 4 is shorter than that in FIG. 2. Accordingly, in the electromagnetic wave detector of FIG. 4, as compared with the electromagnetic wave detector in FIG. 2, in the photocarriers generated in semiconductor layer 4 by the electromagnetic wave reflected or scattered by second electrode 2b, the photocarriers that are not injected into region 1c of two-dimensional material layer 1 but are deactivated are reduced, and the photocurrent is increased.

Second Modification

In an electromagnetic wave detector according to a second modification in FIG. 5, opening 3a of insulating film 3 and region 1c of two-dimensional material layer 1 are disposed on bottom 41b. For this reason, the portion connecting region 1a and region 1c in region 1b of two-dimensional material layer 1 is disposed on the entire at least two side portions and the entire one top. Accordingly, the length of the portion connecting region 1c and region 1a in region 1b of FIG. 4 is longer than that of FIG. 2.

In the electromagnetic wave detector of FIG. 5, as compared with the electromagnetic wave detector of FIG. 2, the region where the photocarriers injected from semiconductor layer 4 into two-dimensional material layer 1 during the electromagnetic wave irradiation are modulated by the photogating effect increases to make contribution of the photogating effect large, so that the detection sensitivity is high.

Third Modification

In an electromagnetic wave detector according to a third modification in FIG. 6, opening 3a of insulating film 3 and region 1c of two-dimensional material layer 1 are disposed on one side portion 42 that does not face first electrode 2a in two side portions 42. For this reason, the portion connecting region 1a and region 1c in region 1b of two-dimensional material layer 1 is disposed on the entire at least one side portion and the entire one top. Accordingly, the length of the portion connecting region 1c and region 1a in region 1b of FIG. 6 is longer than that of FIG. 2.

As illustrated in FIG. 5, when opening 3a of insulating film 3 is disposed on bottom 41, bottom 41 is preferably provided in parallel with back surface 44 from the viewpoint of accurately and easily forming opening 3a. On the other hand, in the electromagnetic wave detector of the third modification, when one side portion 42 and the other side portion 42 are provided in parallel, opening 3a can be accurately and easily formed even when bottom 41 is not provided in parallel with back surface 44. As a result, in the electromagnetic wave detector of the third modification, an area (pixel area) in a plan view can be reduced as compared with the electromagnetic wave detector of the second modification. As a result, when a plurality of electromagnetic wave detectors are arranged to form the electromagnetic wave detector assembly, each electromagnetic wave detector can be arranged at high density.

Fourth Modification

Figure 7:
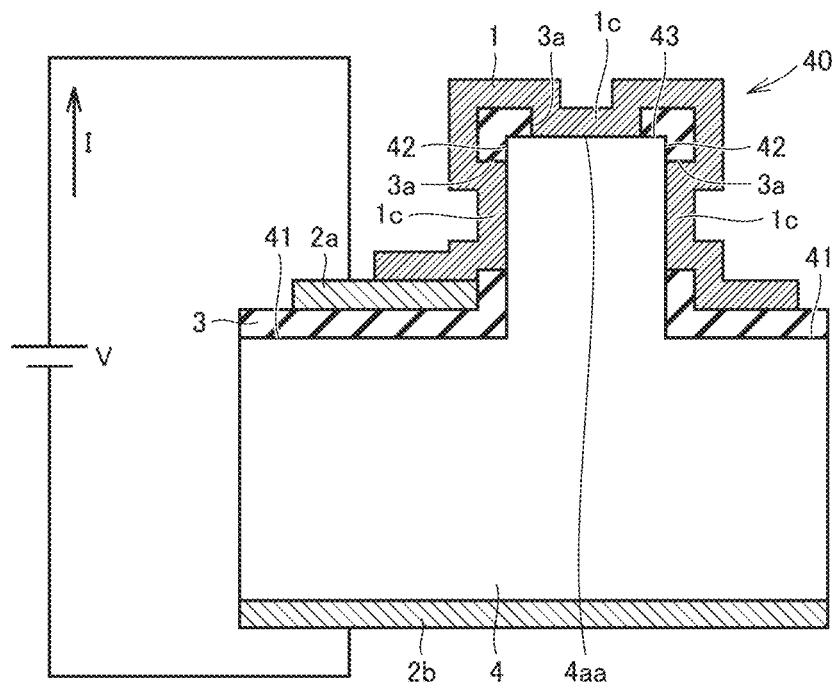
FIG. 7 is a sectional view illustrating a fourth modification of the electromagnetic wave detector of the first embodiment.

An electromagnetic wave detector according to a fourth modification in FIG. 7 basically has the same configuration as the electromagnetic wave detector in FIG. 2, and is different from the electromagnetic wave detector in FIG. 2 in that the plurality of openings 3a and region 1c are provided with respect to step 40.

In the electromagnetic wave detector of the fourth modification, the area of a junction surface 4aa between two-dimensional material layer 1 and semiconductor layer 4 is larger than that of the electromagnetic wave detector in FIG. 2. As described above, because the material constituting two-dimensional material layer 1 is different from the material constituting semiconductor layer 4, work functions are also different from each other. As a result, region 1c in contact with semiconductor layer 4 in two-dimensional material layer 1 is doped with carriers, but the doping amount to region 1c is greatly affected by the number and size of the contact region between two-dimensional material layer 1 and semiconductor layer 4. Extraction efficiency of the photocarriers generated in semiconductor layer 4 when the electromagnetic wave is incident on two-dimensional material layer 1 is greatly affected by the doping amount to region 1c.

In the electromagnetic wave detector of the fourth modification, the number and size of the contact region between two-dimensional material layer 1 and semiconductor layer 4 can be adjusted by the number of openings 3a and each opening area. As a result, in the electromagnetic wave detector of the fourth modification, the extraction efficiency of the photocarriers generated in semiconductor layer 4 to two-dimensional material layer 1 when the electromagnetic wave is incident is enhanced as compared with the electromagnetic wave detector in FIG. 2. In addition, in the electromagnetic wave detector of the fourth modification, because a plurality of paths through which the photocarriers are transmitted is formed in two-dimensional material layer 1, even when a defect or an abnormality is generated in any of the paths during manufacturing or use, a decrease in yield or the generation of a failure is prevented.

Fifth Modification

Figure 8:
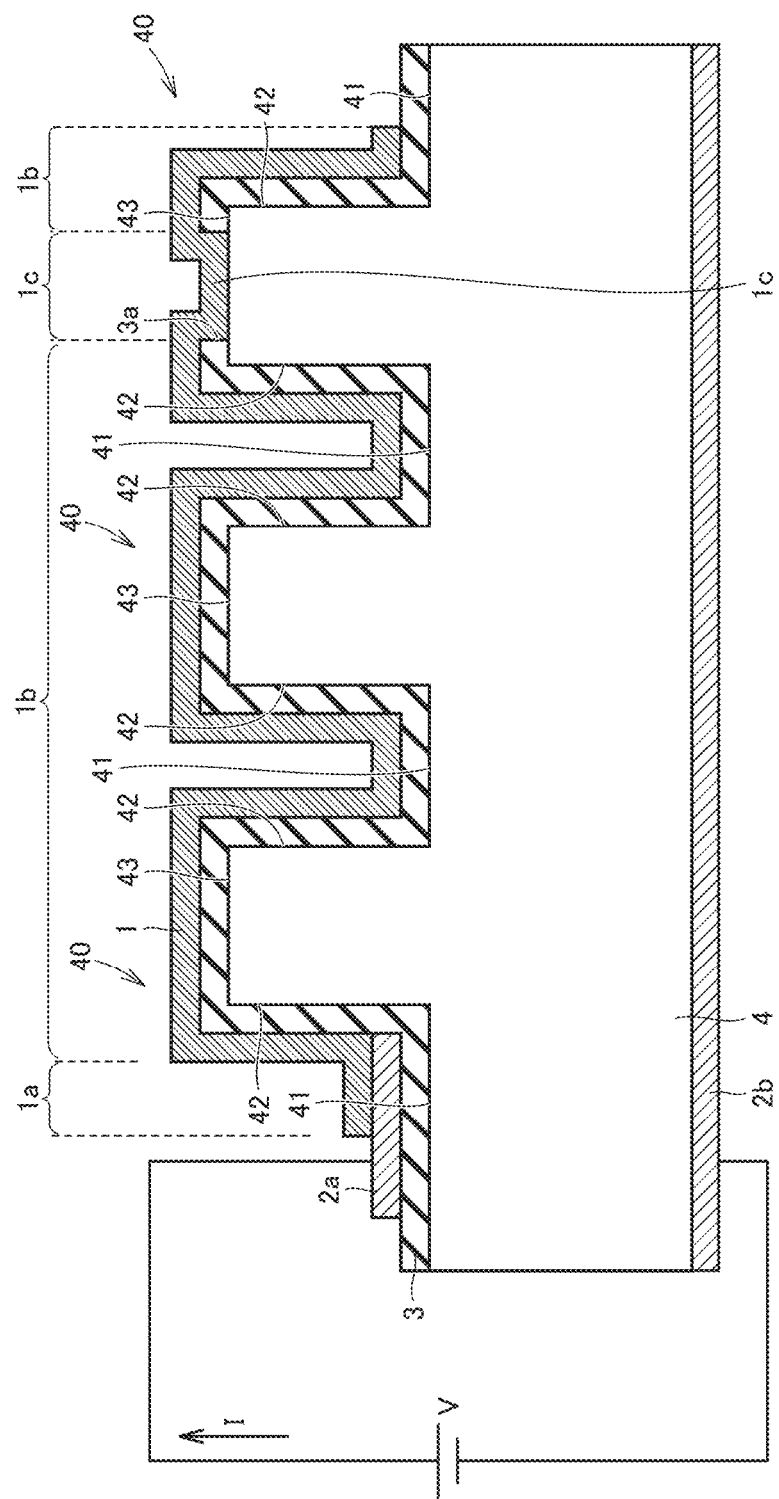
FIG. 8 is a sectional view illustrating a fifth modification of the electromagnetic wave detector of the first embodiment.
Figure 9:
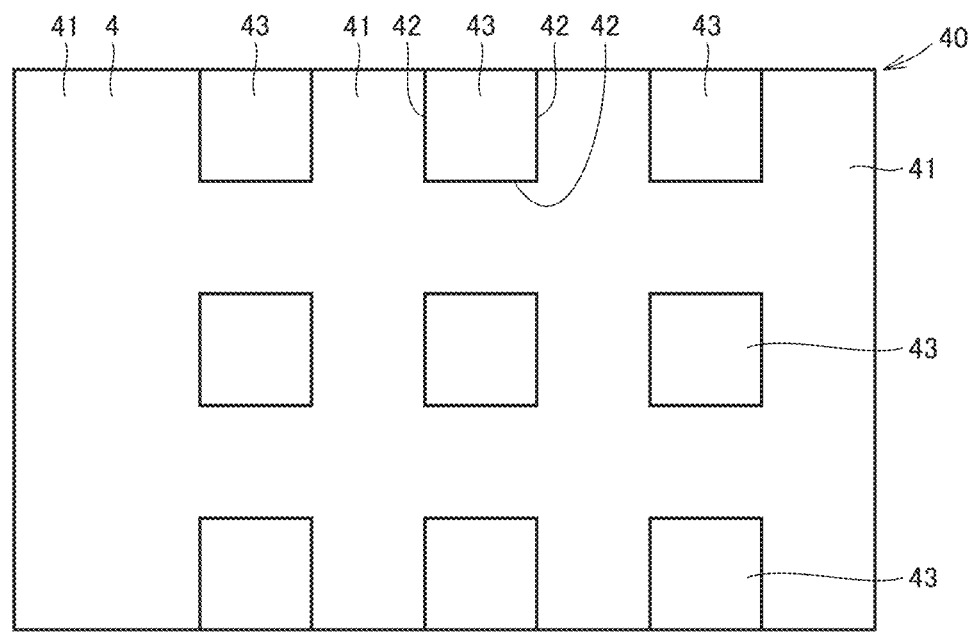
FIG. 9 is a schematic plan internal view illustrating an example of arrangement of a step according to the fifth modification of the electromagnetic wave detector of the first embodiment.
Figure 10:
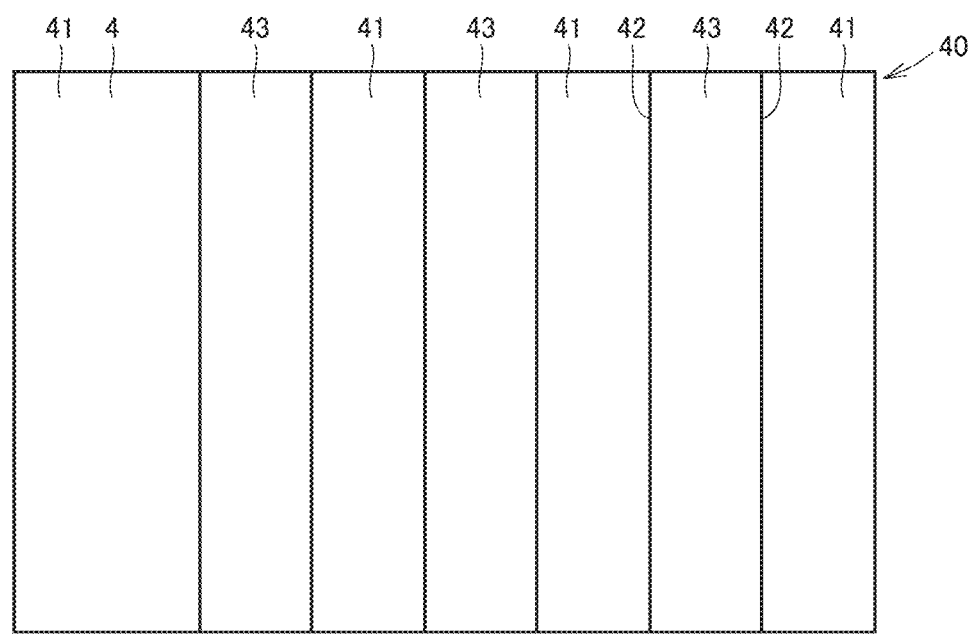
FIG. 10 is a schematic plan internal view illustrating another example of arrangement of the step according to the fifth modification of the electromagnetic wave detector of the first embodiment.

Electromagnetic wave detectors according to a fifth modification in FIGS. 8, 9, and 10 basically have the same configuration as the electromagnetic wave detector in FIG. 2, and are different from that of the electromagnetic wave detector in FIG. 2 in that a plurality of steps 40 are formed. In FIGS. 9 and 10, only semiconductor layer 4 is illustrated in order to describe the shape and arrangement of the plurality of steps 40.

The plurality of steps 40 include a plurality of bottoms 41, a plurality of side portions 42, and a plurality of tops 43. For example, at least two steps 40 are disposed between opening 3a of insulating film 3 and first electrode 2a. As illustrated in FIG. 5, for example, opening 3a of insulating film 3 is disposed on step 40 farthest from first electrode 2a. For example, opening 3a of insulating film 3 is disposed on top 43 of step 40 farthest from first electrode 2a.

In this way, the length of region 1b extending between region 1a connected to first electrode 2a and region 1c connected to semiconductor layer 4 in opening 3a is longer than the length of each region 1b in FIGS. 2 and 4 to 6.

As a result, in the electromagnetic wave detector of FIG. 5, compared with the electromagnetic wave detectors of FIGS. 2 and 4 to 6, the region where the photocarriers injected from semiconductor layer 4 into two-dimensional material layer 1 during the electromagnetic wave irradiation are modulated by the photogating effect increases to make contribution of the photogating effect large, so that the detection sensitivity is high.

In addition, as illustrated in FIGS. 9 and 10, diffraction and interference between the electromagnetic waves incident on semiconductor layer 4 is induced by forming the plurality of steps in a lattice pattern in semiconductor layer 4. In an example of the grid-like pattern, as illustrated in FIG. 9, the plurality of steps 40 that are provided so as to have the same or different planar shapes are arranged at equal intervals in two directions orthogonal to each other. In another example of the grid-like pattern, as illustrated in FIG. 10, steps 40 that are provided so as to have the same or different planar shapes extend in one direction and are arranged at equal intervals in another direction orthogonal to the one direction.

Thus, only the electromagnetic wave having the specific wavelength passes through semiconductor layer 4 or is absorbed by semiconductor layer 4. Further, only the electromagnetic wave having the specific wavelength is intensified while being subjected to the action of diffraction, and propagates on the surface of semiconductor layer 4. Accordingly, in the electromagnetic wave detector of the fifth modification, the detection sensitivity of the electromagnetic wave detector can be controlled by the shape and arrangement of the plurality of steps 40.

Furthermore, a part of the electromagnetic wave incident on the region other than the region located under opening 3a in step 40 of semiconductor layer 4 can be propagated to the region located under opening 3a to generate the photocarriers. Accordingly, when the plurality of steps 40 are formed as the lattice-like pattern in FIGS. 9 and 10, the amount of photocarriers injected from semiconductor layer 4 into two-dimensional material layer 1 increases to improve the sensitivity of the electromagnetic wave photodetector as compared with the case where the plurality of steps 40 are not formed as the lattice-like pattern in FIGS. 9 and 10.

Furthermore, region 1b of two-dimensional material layer 1 is disposed on the surface of step 40 through which the diffracted electromagnetic wave propagates through insulating film 3. For this reason, region 1b absorbs the diffracted electromagnetic wave, thereby increasing the generation amount of photocarriers. In addition, the electric field effect applied to region 1b is also enhanced. As a result, the sensitivity of the electromagnetic wave detector in which the plurality of steps 40 are formed as the lattice-shaped pattern in FIGS. 9 and 10 is higher than that in the case where the plurality of steps 40 are not formed as the lattice-shaped pattern in FIGS. 9 and 10.

In FIG. 8, only one opening 3a is formed in insulating film 3, and opening 3a is disposed on one top 43 of the plurality of steps 40. However, the present disclosure is not limited thereto. A plurality of openings 3a may be formed in insulating film 3, and openings 3a may be disposed on steps 40 different from each other. Furthermore, each opening 3a may be disposed in at least one of top 43, bottom 41, and side portion 42 of each step 40.

Sixth Modification, Seventh Modification, Eighth Modification, Ninth Modification Electromagnetic wave detectors in FIGS. 11, 12, 13, 14 basically have the same configuration as the electromagnetic wave detector in FIGS. 1 and 2, and are different from the electromagnetic wave detector in FIGS. 1 and 2 in that the planar shape of region 1c in contact with semiconductor layer 4 inside opening 3a in two-dimensional material layer 1 is different from the planar shape of region 1c in the electromagnetic wave detector in FIG. 1.

The area of the contact region between region 1c and top 43 in FIGS. 11 to 14 is smaller than the area of the contact region between region 1c and top 43 in FIGS. 1 and 2. In the electromagnetic wave detectors of FIGS. 11 to 14, the area of the contact region between region 1c and top 43 is smaller than the sum of the occupied areas of region 1a (electrode connection region) and region 1b in a plan view.

Figure 11:
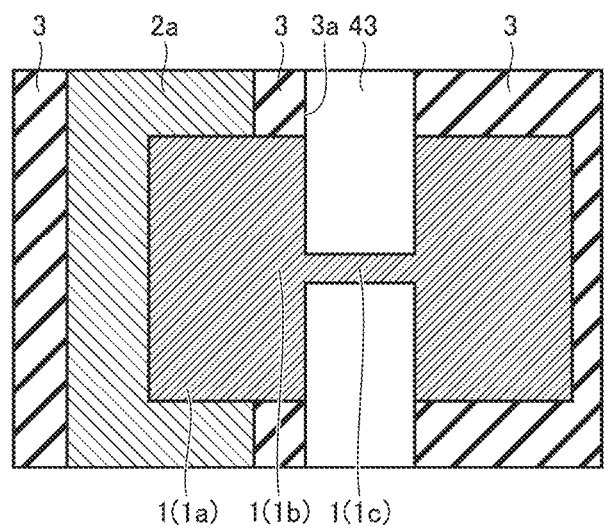
FIG. 11 is a schematic plan view illustrating a sixth modification of the electromagnetic wave detector of the first embodiment.
Figure 12:
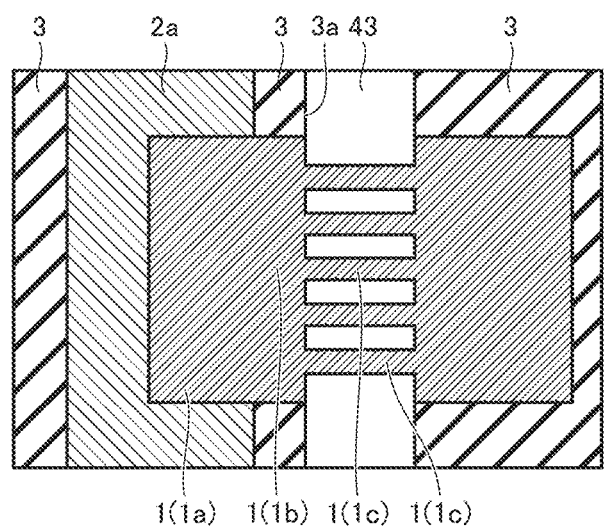
FIG. 12 is a schematic plan view illustrating a seventh modification of the electromagnetic wave detector of the first embodiment.
Figure 13:
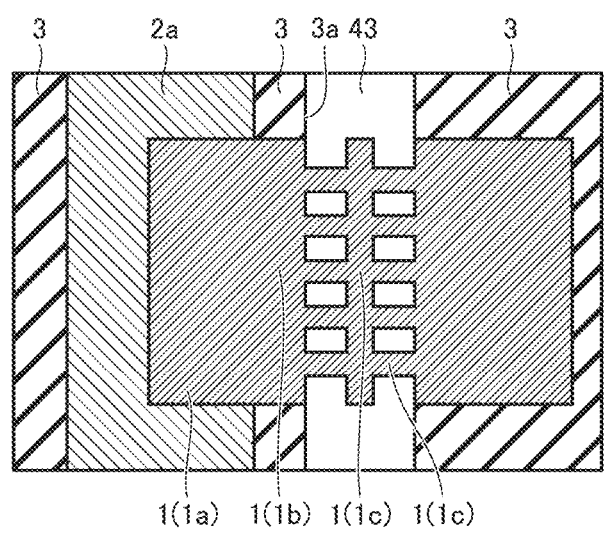
FIG. 13 is a schematic plan view illustrating an eighth modification of the electromagnetic wave detector of the first embodiment.
Figure 14:
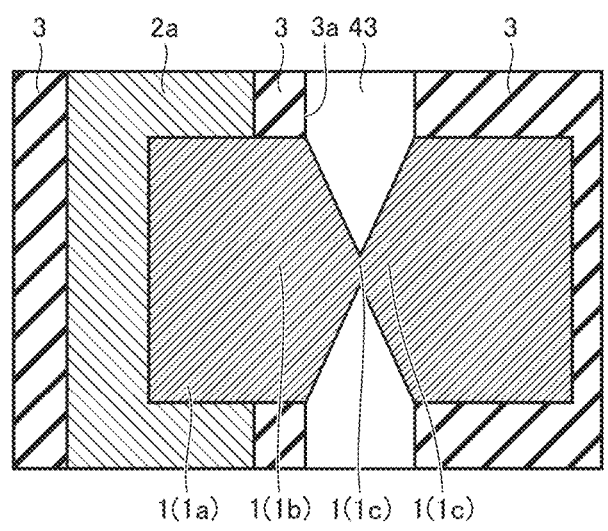
FIG. 14 is a schematic plan view illustrating a ninth modification of the electromagnetic wave detector of the first embodiment.

Each region 1c in FIGS. 11 to 14 corresponds to the region obtained by removing the plurality of regions spaced apart from region 1c illustrated in FIG. 1 in at least the longitudinal direction of top 43, in other words, in the direction intersecting the direction in which region 1a (electrode connection region), region 1b, and region 1c of two-dimensional material layer 1 are arranged. In FIGS. 11 to 13, each planar shape of the plurality of regions is a rectangular shape. In FIG. 14, each planar shape of the plurality of regions is a triangular shape.

Each planar shape of each region 1c in FIGS. 11 to 14 is symmetrical with respect to a straight line extending along the longitudinal direction through the center in the lateral direction of top 43. Each planar shape of region 1c in FIGS. 11 to 14 is symmetrical with respect to a straight line extending along the lateral direction through the center in the longitudinal direction of top 43.

The planar shape of region 1c in FIG. 11 has a ribbon shape. In two-dimensional material layer 1 of FIG. 11, the width of region 1c in the longitudinal direction of top 43 is narrower than the widths of region 1a and region 1b in the longitudinal direction.

The planar shape of region 1c in FIG. 12 has a comb shape (ladder shape). In two-dimensional material layer 1 of FIG. 12, the sum of the widths of region 1c in the longitudinal direction of top 43 is narrower than the widths of region 1a and region 1b in the longitudinal direction. In two-dimensional material layer 1 of FIG. 12, the plurality of openings exposing top 43 are formed, and the plurality of openings are arranged in the longitudinal direction of top 43.

The planar shape of region 1c in FIG. 13 has a lattice shape. In two-dimensional material layer 1 of FIG. 13, the plurality of openings exposing top 43 are formed, and the plurality of openings are arranged in each of the longitudinal direction and the lateral direction of top 43. In two-dimensional material layer 1 of FIG. 13, the minimum value of the sum of the widths of region 1c in the longitudinal direction of top 43 is narrower than the minimum widths of region 1a and region 1b in the longitudinal direction.

In two-dimensional material layer 1 of FIG. 14, the width of region 1c in the longitudinal direction of top 43 gradually narrows as region 1c goes away from region 1b in the lateral direction of top 43, and becomes narrowest at the center in the lateral direction. In other words, the width of region 1c in the direction intersecting the arrangement direction of each of regions 1a, 1b, 1c of two-dimensional material layer 1 gradually narrows as region 1c goes away from region 1a and region 1b in the arrangement direction. For example, the width of region 1c in the direction intersecting the arrangement direction of each of regions 1a, 1b, 1c of two-dimensional material layer 1 is the narrowest at the center of region 1c in the arrangement direction.

In FIGS. 11 to 14, the area of the contact region between two-dimensional material layer 1 and semiconductor layer 4 is adjusted according to the width of region 1c in the longitudinal direction of top 43. Accordingly, in the electromagnetic wave detectors of FIGS. 11 to 14, the contact resistance between two-dimensional material layer 1 and semiconductor layer 4, and thus the resistance of the electromagnetic wave detector can be adjusted. In the electromagnetic wave detectors of FIGS. 11 to 14, variations in characteristics of the electromagnetic wave detector can be reduced and a dark current can be reduced as compared with the electromagnetic wave detector of FIGS. 1 and 2.

In addition, the sum of the areas of the end surfaces of region 1c in FIGS. 12 to 14 is larger than the sum of the areas of the end surfaces of region 1c in FIGS. 1 and 2. The end surface of region 1c is a surface extending along the thickness direction of two-dimensional material layer 1, in other words, the direction orthogonal to the sheet in which atoms are two-dimensionally arranged in two-dimensional material layer 1. In other words, the end surface region of the two-dimensional crystal structure in each region 1c of FIGS. 12 to 14 is larger than the end surface region of the two-dimensional crystal structure in region 1c of FIGS. 1 and 2. For this reason, in each two-dimensional material layer 1 of FIGS. 12 to 14, the ratio of unjoined hands (dangling bonds) of the two-dimensional crystal structure increases as compared with two-dimensional material layer 1 of FIGS. 1 and 2. As a result, when carriers generated in semiconductor layer 4 by electromagnetic wave irradiation are transported to first electrode 2a through two-dimensional material layer 1, in each two-dimensional material layer 1 of FIGS. 12 to 14, the rate of change in the carrier density increases, the carrier mobility increases, and the change amount of current I increases as compared with two-dimensional material layers 1 of FIGS. 1 and 2. As a result, the sensitivity of each electromagnetic wave detector of FIGS. 12 to 14 is higher than the sensitivity of the electromagnetic wave detectors of FIGS. 1 and 2.

In each modification of the first embodiment described above, region 1c of two-dimensional material layer 1 may be the graphene nanoribbon. The graphene nanoribbon has a band gap that varies depending on the width of the graphene nanoribbon. Accordingly, the wavelength range of the electromagnetic wave that can be photoelectrically converted in region 1c can be adjusted according to the width in the longitudinal direction of region 1c constituted by the graphene nanoribbon, and for example, the wavelength range of the electromagnetic wave can be narrower than the wavelength range of the electromagnetic wave that can be photoelectrically converted in other regions 1a, 1b. In this case, the photocarriers generated by the photoelectric conversion in region 1c can be detected separately from the photocarriers generated by the photoelectric conversion in other regions 1a, 1b. In addition, the sensitivity of the electromagnetic wave detector is improved by detecting the photocarriers generated by the photoelectric conversion in region 1c. In addition, in such an electromagnetic wave detector, because region 1c formed of the graphene nanoribbon and semiconductor layer 4 form a Schottky junction, the dark current is reduced, and the sensitivity is improved by detecting the photocarriers generated by the electromagnetic wave absorbed in a Schottky junction portion.

Although region 1c in FIGS. 11 to 14 is disposed on top 43 of step 40, the present disclosure is not limited thereto. For example, the planar shape of region 1c in FIGS. 4 and 5 may be formed similarly to region 1c in any one of FIGS. 11 to 14.

Ten Modification, Eleventh Modification, Twelfth Modification

Figure 15:
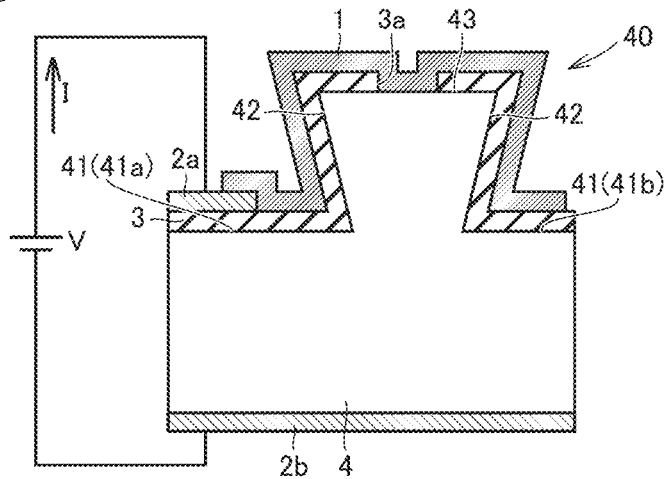
FIG. 15 is a schematic sectional view illustrating a tenth modification of the electromagnetic wave detector of the first embodiment.
Figure 16:
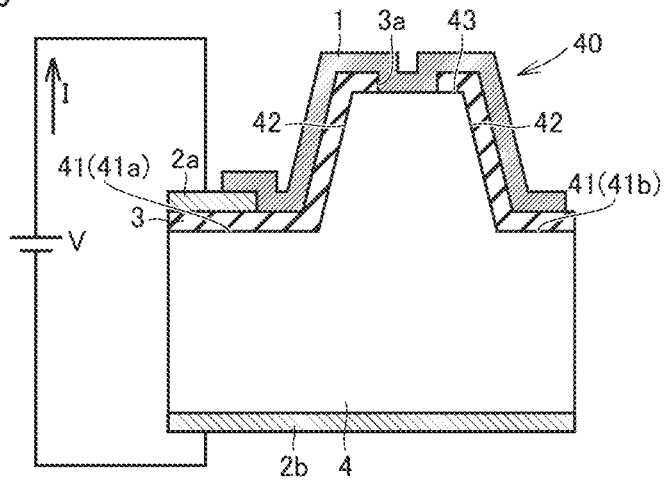
FIG. 16 is a schematic sectional view illustrating an eleventh modification of the electromagnetic wave detector of the first embodiment.
Figure 17:
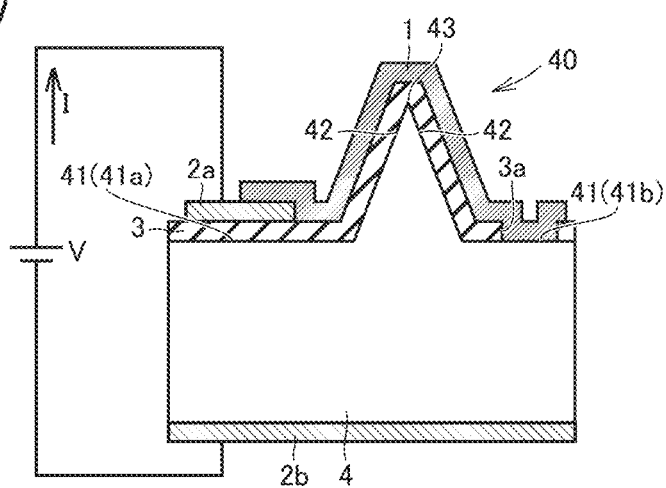
FIG. 17 is a schematic sectional view illustrating a twelfth modification of the electromagnetic wave detector of the first embodiment.

Electromagnetic wave detectors in FIGS. 15, 16, and 17 basically have the same configuration as the electromagnetic wave detector in FIG. 2, and are different from the electromagnetic wave detector in FIG. 2 in that the shape of step 40 on the section perpendicular to the longitudinal direction of top 43 has a tapered shape.

The interval between two side portions 42 on the side of bottom 41 is different from the interval between two side portions 42 on the side of top 43. In a tenth modification of FIG. 15, the interval between two side portions 42 gradually increases from bottom 41 toward top 43. In an eleventh modification of FIG. 16, the interval between two side portions 42 gradually decreases from bottom 41 toward top 43. In a twelfth modification of FIG. 17, the interval between two side portions 42 gradually decreases from bottom 41 toward top 43, and top 43 is linearly provided without forming a plane.

In these cases, region 1b of two-dimensional material layer 1 extending between opening 3a and first electrode 2a can be widely provided as compared with the case where the shape of step 40 on the section perpendicular to the longitudinal direction of top 43 is rectangular as illustrated in FIG. 2. As a result, in each of the electromagnetic wave detectors of the tenth modification, the eleventh modification, and the twelfth modification, the contribution of the photogating effect becomes large as compared with the electromagnetic wave detector in FIG. 2, and the detection sensitivity is enhanced.

Other Modifications

The electromagnetic wave detector of the first embodiment may further include an insulating protective film (not illustrated) disposed to cover the two-dimensional material layer. The insulating protective film may be provided so as to cover peripheries of two-dimensional material layer 1, semiconductor layer 4, and first electrode 2a on insulating film 3. The material constituting the insulating protective film may be any material having an electrical insulation property, and for example, includes at least one selected from the group consisting of $SiO_2$, $Si_3N_4$, $HfO_2$, $Al_2O_3$, and BN.

In addition, the electromagnetic wave detector of the first embodiment may be used in combination with an electromagnetic wave detector (not illustrated) that has the same structure as the electromagnetic wave detector of the first embodiment and is shielded from the electromagnetic wave that is the detection target, and detect a difference in output between the two electromagnetic wave detectors. An influence such as a change in characteristic depending on the environmental temperature can be prevented by detecting the difference in this manner, so that the highly accurate detection can be performed.

In addition, the electromagnetic wave detector of the first embodiment may be constituted integrally with an output amplifier circuit (not illustrated) using the graphene. That is, the output amplifier circuit using the graphene may be further provided on semiconductor layer 4 of the electromagnetic wave detector of the first embodiment. In the output amplifier circuit using the graphene, the operation is faster than that of an output amplifier circuit using a silicon-based semiconductor material, and the high-performance electromagnetic wave detector can be implemented. In addition, high-speed readout and simplification of the manufacturing process can be achieved using the graphene for a peripheral circuit such as a readout circuit.

The above-described first to twelfth modifications can also be applied to other embodiments described below.

Second Embodiment

Figure 18:
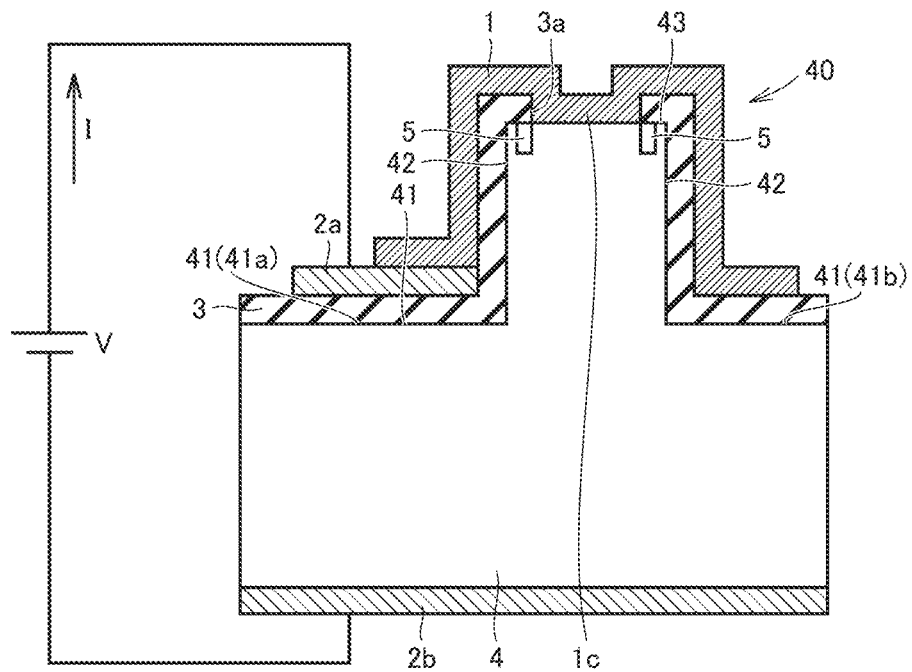
FIG. 18 is a schematic sectional view illustrating an electromagnetic wave detector according to a second embodiment.
Figure 19:
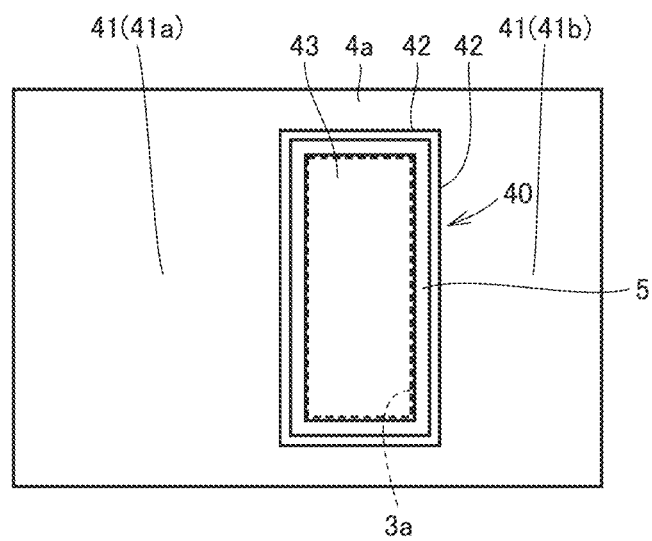
FIG. 19 is a schematic plan internal view illustrating the electromagnetic wave detector of the second embodiment.

FIG. 18 is a schematic sectional view illustrating an electromagnetic wave detector according to a second embodiment. FIG. 19 is a schematic plan internal view illustrating the electromagnetic wave detector of the second embodiment. As illustrated in FIGS. 18 and 19, the electromagnetic wave detector of the second embodiment has a configuration basically similar to that of the electromagnetic wave detector of the first embodiment, and can obtain similar effects. However, the electromagnetic wave detector of the second embodiment is different from the electromagnetic wave detector of the first embodiment in that semiconductor layer 4 includes a current interruption structure. In FIG. 19, only opening 3a of insulating film 3, semiconductor layer 4, and a current interruption structure 5 are illustrated in order to describe the position of a current interruption mechanism.

Current interruption structure 5 is a portion capable of interrupting the current. Specifically, current interruption structure 5 is a portion interrupting the movement of carriers between the region facing region 1b through insulating film 3 and the region connected to region 1c in semiconductor layer 4.

As illustrated in FIG. 18, current interruption structure 5 is disposed in the region facing insulating film 3 in semiconductor layer 4. As illustrated in FIG. 19, in a plan view, current interruption structure 5 is disposed so as to surround an opening end of opening 3a. When region 1c and opening 3a are disposed on top 43 of step 40, current interruption structure 5 is disposed on top 43. Current interruption structure 5 has one end that is exposed from semiconductor layer 4 at top 43 and connected to insulating film 3, and the other end embedded in semiconductor layer 4. The distance (depth) between one end and the other end of current interruption structure 5 and the width in the direction intersecting the distance are not particularly limited as long as diffusion of carriers can be prevented.

The specific structure of current interruption structure 5 is not particularly limited as long as the specific structure is the structure that interrupts the current. For example, current interruption structure 5 may be a trench formed in semiconductor layer 4. The inside of the trench may be hollow or filled with an insulator. In addition, current interruption structure 5 may be the region doped with the impurity having a higher concentration than that of semiconductor layer 4, and the region having conductivity higher than that of semiconductor layer 4. In addition, current interruption structure 5 may be the region that is formed by embedding a metal material in the trench and has the conductivity higher than that of semiconductor layer 4.

In the electromagnetic wave detector of the second embodiment, the photocarriers generated in semiconductor layer 4 are separated into carriers injected into region 1c of two-dimensional material layer 1 and carriers contributing to the photogating effect that gives the electric field change to region 1b of two-dimensional material layer 1 through insulating film 3 by current interruption structure 5. For example, when the width of opening 3a in insulating film 3 is narrower than the diffusion length of the photocarriers in the semiconductor material constituting semiconductor layer 4 and when current interruption structure 5 is not provided, the photocarriers under insulating film 3 contribute to the photogating effect and are injected into two-dimensional material layer 1. In this case, the amplification of the current change due to the photogating effect is caused while delayed with respect to the generation of the optical carrier. On the other hand, in the electromagnetic wave detector of the second embodiment, the carriers contributing to the photogating effect and the carriers injected into two-dimensional material layer 1 are separated by current interruption structure 5. As a result, the delay is eliminated, and the response speed of the electromagnetic wave detector is improved. When the plurality of electromagnetic wave detectors of the second embodiment are arranged to form the electromagnetic wave detector assembly, the respective pixels are separated.

Modification

Figure 20:
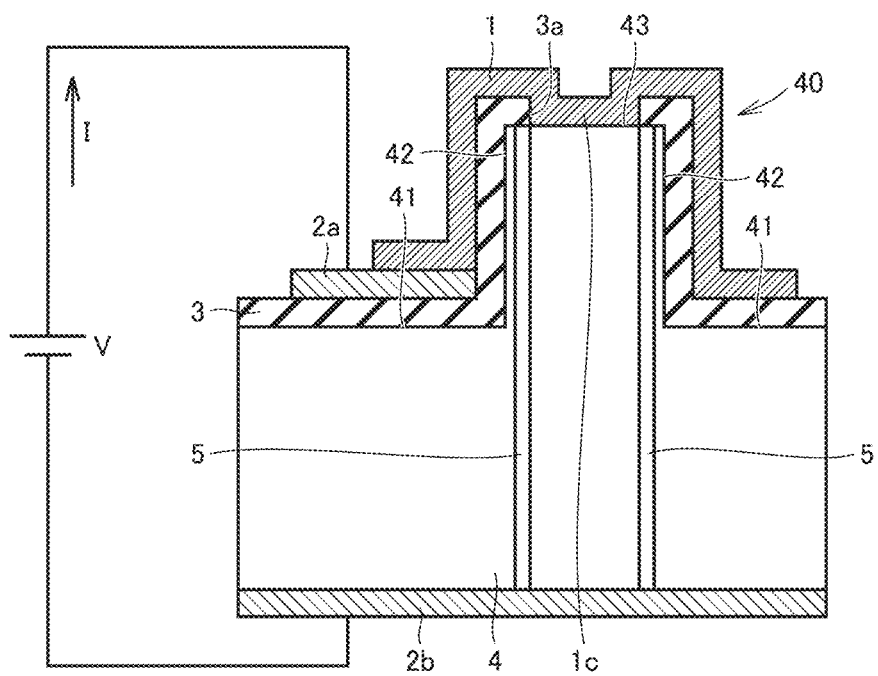
FIG. 20 is a schematic sectional view illustrating a modification of the electromagnetic wave detector of the second embodiment.

The electromagnetic wave detector in FIG. 20 has basically the same configuration as the electromagnetic wave detector of the second embodiment in FIGS. 18 and 19, but is different from the electromagnetic wave detector of the second embodiment in that current interruption structure 5 is formed so as to penetrate semiconductor layer 4 and reach second electrode 2b.

The configurations of the electromagnetic wave detector of the second embodiment and the modifications thereof can also be applied to other embodiments.

Third Embodiment

Figure 21:
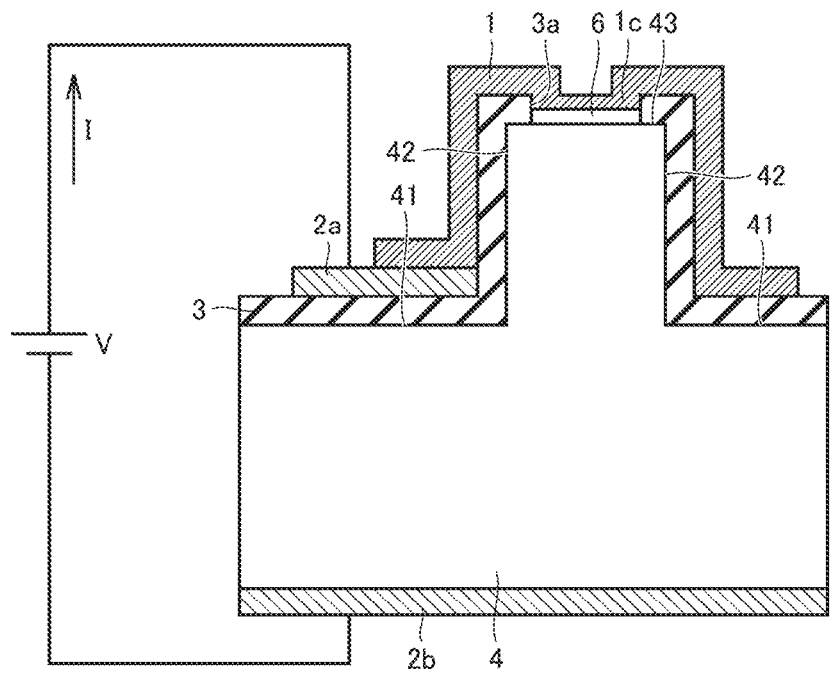
FIG. 21 is a schematic sectional view illustrating an electromagnetic wave detector according to a third embodiment.

FIG. 21 is a sectional view illustrating an electromagnetic wave detector according to a third embodiment. As illustrated in FIG. 21, the electromagnetic wave detector of the third embodiment basically has the same configuration as the electromagnetic wave detector of the first embodiment and can obtain the same effect, but is different from the electromagnetic wave detector of the first embodiment in that a buffer layer 6 is disposed between two-dimensional material layer 1 and semiconductor layer 4 inside opening 3a of insulating film 3.

Buffer layer 6 electrically connects region 1c of two-dimensional material layer 1 and semiconductor layer 4. Specifically, buffer layer 6 is provided such that a tunnel is generated between region 1c of two-dimensional material layer 1 and semiconductor layer 4 to electrically connect region 1c of two-dimensional material layer 1 and semiconductor layer 4 by a tunnel current. The material constituting buffer layer 6 may be any material having the electrical insulation property, and for example, includes at least one selected from the group consisting of $SiO_2$, $Si_3N_4$, $HfO_2$, $Al_2O_3$, and BN. The thickness of buffer layer 6 is set such that the tunnel current can be generated between two-dimensional material layer 1 and semiconductor layer 4 when the electromagnetic wave is incident.

For example, the thickness of buffer layer 6 is greater than or equal to 1 nm and less than or equal to 10 nm. A method for manufacturing buffer layer 6 can be any method, and for example, selected from an atomic layer deposition (ALD) method, a vacuum deposition method, a sputtering method, and the like. Alternatively, buffer layer 6 may be formed by oxidizing or nitriding the surface of semiconductor layer 4. Alternatively, buffer layer 6 may be a natural oxide film formed on the surface of semiconductor layer 4.

The electromagnetic wave detector of the third embodiment further includes buffer layer 6. Buffer layer 6 is disposed between two-dimensional material layer 1 and semiconductor layer 4 inside opening 3a. Buffer layer 6 has the thickness capable of forming the tunnel current between two-dimensional material layer 1 and semiconductor layer 4. In this case, by setting the film thickness of buffer layer 6 to such the thickness that tunnel injection is generated from semiconductor layer 4 to two-dimensional material layer 1, the injection efficiency is improved to inject the large photocurrent into two-dimensional material layer 1, and the sensitivity of the electromagnetic wave detector can be improved. In addition, buffer layer 6 prevents a leakage current at the junction interface between semiconductor layer 4 and two-dimensional material layer 1, so that the dark current can be reduced.

Modification

Figure 22:
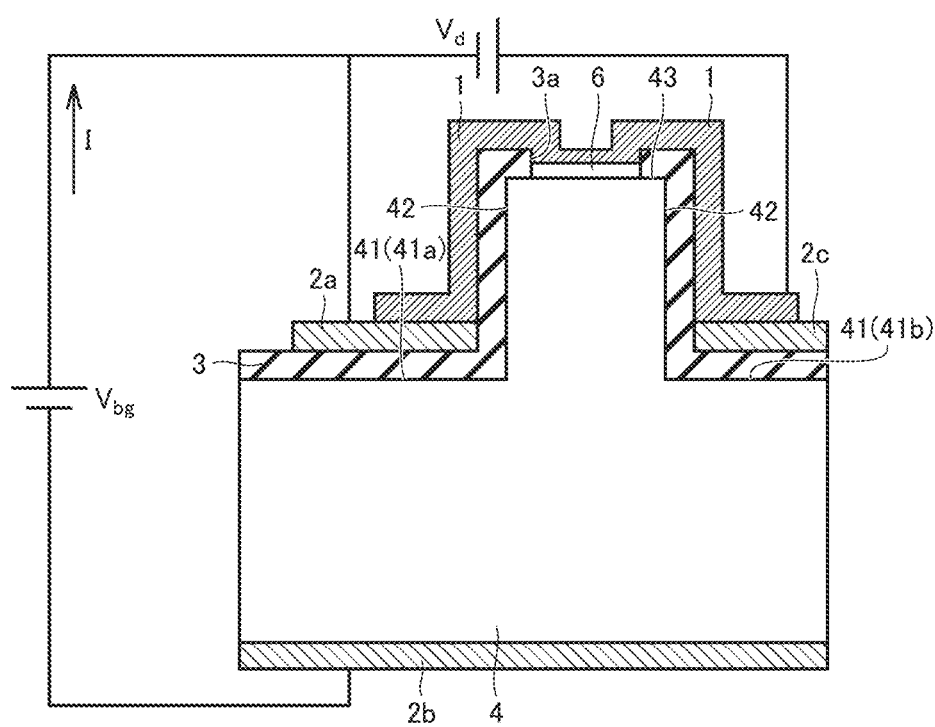
FIG. 22 is a schematic sectional view illustrating a modification of the electromagnetic wave detector of the third embodiment.

An electromagnetic wave detector in FIG. 22 has a configuration basically similar to that of the electromagnetic wave detector of the third embodiment in FIG. 21, but is different from the electromagnetic wave detector of the third embodiment in that a third electrode 2c different from first electrode 2a is further provided on the surface of insulating film 3.

Third electrode 2c is preferably disposed in the region opposite to the region where first electrode 2a is located when viewed from opening 3a. Two-dimensional material layer 1 is also connected to electrode 2c. For example, a source-drain voltage Vd is applied between first electrode 2a and third electrode 2c. Thus, the photocurrent extracted from two-dimensional material layer 1 can be increased.

The configurations of the electromagnetic wave detectors of the third embodiment and the modifications thereof can also be applied to other embodiments.

Fourth Embodiment

Figure 23:
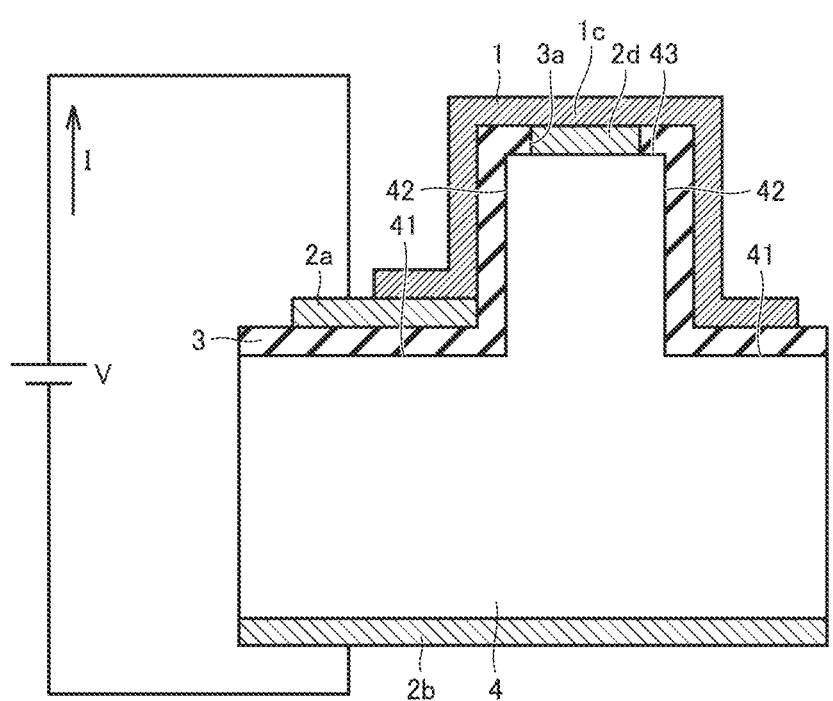
FIG. 23 is a schematic sectional view illustrating an electromagnetic wave detector according to a fourth embodiment.

FIG. 23 is a schematic sectional view illustrating an electromagnetic wave detector according to a fourth embodiment. As illustrated in FIG. 23, the electromagnetic wave detector of the fourth embodiment has a configuration basically similar to that of the electromagnetic wave detector of the first embodiment and can obtain similar effects, but is different from the electromagnetic wave detector of the first embodiment in that a connection conductor 2d is formed inside opening 3a of insulating film 3.

Connection conductor 2d electrically connects semiconductor layer 4 and region 1c of two-dimensional material layer 1. Region 1c of two-dimensional material layer 1 is disposed so as to overlap the upper surface of connection conductor 2d. The back surface of connection conductor 2d is electrically connected to the front surface of semiconductor layer 4. Two-dimensional material layer 1 and the upper surface of connection conductor 2d are electrically connected. From a different point of view, region 1c of two-dimensional material layer 1 is electrically connected to semiconductor layer 4 through connection conductor 2d. The position of the upper surface of connection conductor 2d is substantially the same as the position of the upper surface of insulating film 3. Two-dimensional material layer 1 extends in a planar shape from the upper surface of insulating film 3 to the upper surface of connection conductor 2d without being bent.

Connection conductor 2d has desirably ohmic junction to semiconductor layer 4. In addition, connection conductor 2d desirably exhibits high transmittance at the wavelength of the electromagnetic wave detected by the electromagnetic wave detector. Preferably, the material constituting connection conductor 2d is a material in which the characteristic is changed by the electromagnetic wave irradiation and a change in potential is given to two-dimensional material layer 1, and for example, includes at least one selected from the group consisting of a quantum dot, a ferroelectric material, a liquid crystal material, a fullerene, a rare earth oxide, a semiconductor material, a pn junction material, a metal-semiconductor junction material, and a metal-insulator-semiconductor junction material. For example, when the material constituting connection conductor 2d is the ferroelectric material having a polarization effect (pyroelectric effect) by the electromagnetic wave, the polarization of the ferroelectric is changed by the irradiation of the electromagnetic wave, and the potential can be changed in two-dimensional material layer 1.

The electromagnetic wave detector includes connection conductor 2d. Connection conductor 2d electrically connects semiconductor layer 4 and two-dimensional material layer 1 inside opening 3a. Connection conductor 2d has desirably the ohmic junction to semiconductor layer 4. In addition, desirably connection conductor 2d exhibits the high transmittance at the detection wavelength of the electromagnetic wave.

In the electromagnetic wave detector of the fourth embodiment, because connection conductor 2d is provided between two-dimensional material layer 1 and semiconductor layer 4, the contact resistance between two-dimensional material layer 1 and semiconductor layer 4 can be reduced as compared with the electromagnetic wave detector of the first embodiment, and attenuation of the photocurrent that becomes a problem when the junction between two-dimensional material layer 1 and semiconductor layer 4 is the Schottky junction can be prevented.

In the electromagnetic wave detector of the fourth embodiment, preferably the thickness of connection conductor 2d and the thickness of insulating film 3 are substantially the same, namely, preferably the position of the upper surface of connection conductor 2d is substantially the same as the position of the upper surface of insulating film 3. In this case, two-dimensional material layer 1 is formed horizontally without being bent, so that the carrier mobility in two-dimensional material layer 1 is improved. The photogating effect is proportional to the mobility, so that the detection sensitivity of the electromagnetic wave detector is improved.

The configuration of the electromagnetic wave detector of the fourth embodiment can also be applied to other embodiments.

Fifth Embodiment

Figure 24:
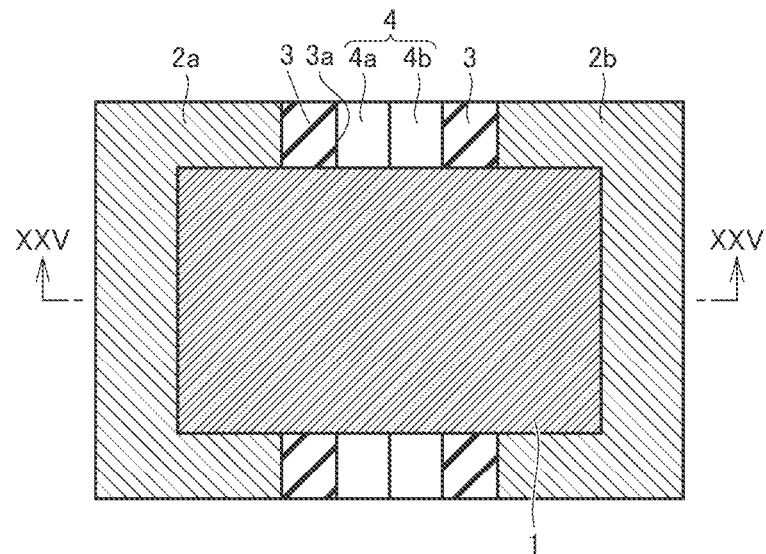
FIG. 24 is a schematic plan view illustrating an electromagnetic wave detector according to a fifth embodiment.
Figure 25:
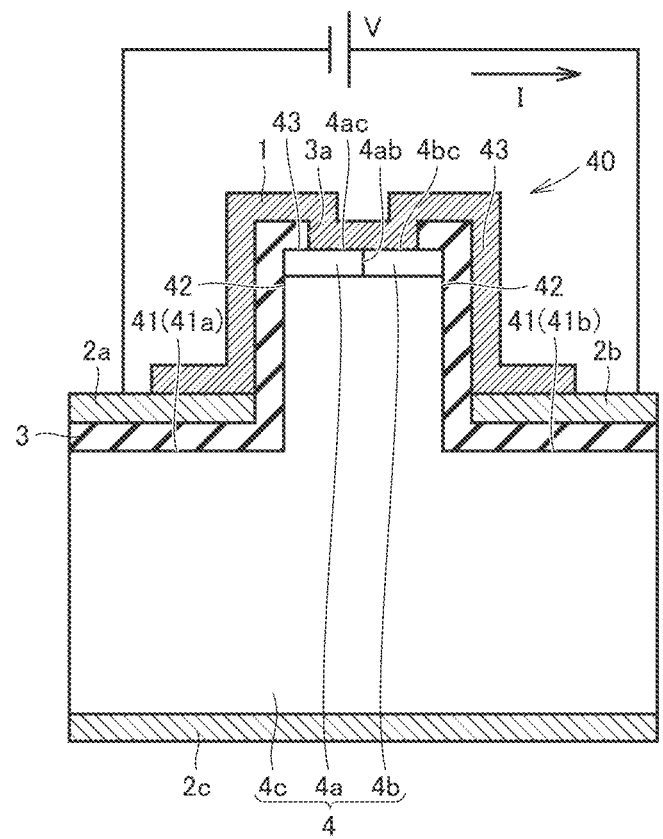
FIG. 25 is a schematic sectional view taken along a line XXV-XXV in FIG. 24.

FIG. 24 is a schematic plan view illustrating an electromagnetic wave detector according to a fifth embodiment. FIG. 25 is a schematic sectional view taken along a line XXV-XXV in FIG. 24.

As illustrated in FIGS. 24 and 25, the electromagnetic wave detector of the fifth embodiment has a configuration basically similar to that of the electromagnetic wave detector according to the first embodiment and can obtain similar effects. However, the electromagnetic wave detector of the fifth embodiment is different from the electromagnetic wave detector of the first embodiment in that semiconductor layer 4 includes a first semiconductor portion 4a having a first conductivity type and a second semiconductor portion 4b having a second conductivity type, and that first semiconductor portion 4a and second semiconductor portion 4b are bonded inside opening 3a.

First semiconductor portion 4a and second semiconductor portion 4b are arranged side by side along the lateral direction of opening 3a. First semiconductor portion 4a is doped with the carrier opposite to that of second semiconductor portion 4b. That is, first semiconductor portion 4a and second semiconductor portion 4b are pn-bonded. First semiconductor portion 4a, second semiconductor portion 4b, and a pn-junction interface 4ab between first semiconductor portion 4a and second semiconductor portion 4b are exposed inside opening 3a. Junction interface 4ab extends along the longitudinal direction of opening 3a. Junction interface 4ab extends below opening 3a of insulating film 3. For example, opening 3a of insulating film 3 is disposed on top 43.

For example, the materials constituting first semiconductor portion 4a and second semiconductor portion 4b are the same semiconductor material. The materials constituting first semiconductor portion 4a and second semiconductor portion 4b may be different semiconductor materials. In this case, the electromagnetic wave detector can be driven in the wavelength band of the electromagnetic wave that can be absorbed by each semiconductor material, so that the wavelength band of the detectable electromagnetic wave can be expanded and selected.

For example, semiconductor layer 4 further includes another semiconductor portion 4c below first semiconductor portion 4a and second semiconductor portion 4b. Another semiconductor portion 4c may have the first conductivity type or the second conductivity type, or may not have any conductivity type. Another electrode 2c may be disposed on another semiconductor portion 4c.

Step 40 includes at least first semiconductor portion 4a and second semiconductor portion 4b. For example, step 40 includes first semiconductor portion 4a, second semiconductor portion 4b, and another semiconductor portion 4c. For example, one bottom 41a, the other bottom 41b, a lower portion of one side portion 42, and a lower portion of the other side portion 42 are constituted by another semiconductor portion 4c. An upper portion of the one side portion 42 and a portion of top 43 located on the side of one side portion 42 are constituted by first semiconductor portion 4a. An upper portion of the other side portion 42 and a portion of top 43 located on the side of the other side portion 42 are constituted by second semiconductor portion 4b.

Second electrode 2b is disposed on bottom 41b. Region 1c of two-dimensional material layer 1 includes a portion electrically connected to first semiconductor portion 4a and a portion electrically connected to second semiconductor portion 4b inside opening 3a. A junction portion 4ac where region 1c of two-dimensional material layer 1 and first semiconductor portion 4a are joined and a junction portion 4bc where region 1c and second semiconductor portion 4b are joined are disposed inside opening 3a.

In addition to region 1a, region 1b, and region 1c, two-dimensional material layer 1 further includes a region 1d that is connected to other portion of region 1b and disposed on the other bottom 41b. Region 1d is electrically connected to second electrode 2b.

As illustrated in FIG. 25, a pn-junction interface 4ab between first semiconductor portion 4a and second semiconductor portion 4b is disposed so as to be in contact with two-dimensional material layer 1. Accordingly, the photocarriers generated at pn-junction interface 4ab between first semiconductor portion 4a and second semiconductor portion 4b by the light irradiation can be easily taken out to two-dimensional material layer 1. Furthermore, the conductivity of two-dimensional material layer 1 on pn-junction interface 4ab changes by receiving the influence of a local electric field change at the pn-junction caused by the photocarriers. As a result, the detection sensitivity of the electromagnetic wave detector is improved.

As illustrated in FIG. 25, two-dimensional material layer 1 is disposed so as to connect first electrode 2a and second electrode 2b. Two-dimensional material layer 1 is connected to semiconductor layer 4 in the region between first electrode 2a and second electrode 2b. As a result, the voltage is applied between first electrode 2a and second electrode 2b, and the photocarriers generated in semiconductor layer 4 can be read out by two-dimensional material layer 1. At this point, in two-dimensional material layer 1, each of the region in contact with first semiconductor portion 4a and the region in contact with second semiconductor portion 4b is doped by each semiconductor portion. For this reason, a gradient of the charge density is formed in two-dimensional material layer 1. As a result, the carrier mobility in two-dimensional material layer 1 is improved, and the detection sensitivity of the electromagnetic wave detector is improved.

Modification

Figure 26:
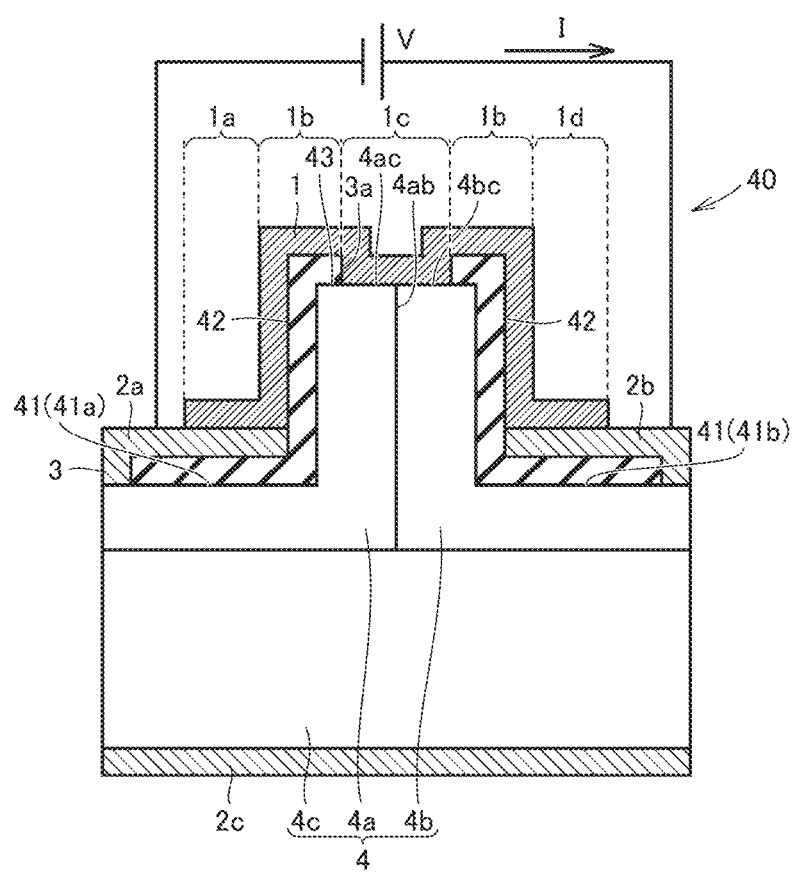
FIG. 26 is a schematic sectional view illustrating a first modification of the electromagnetic wave detector of the fifth embodiment.

The electromagnetic wave detector in FIG. 26 has the same configuration as the electromagnetic wave detector in FIGS. 24 and 25 and can obtain the same effect, but is different from the electromagnetic wave detector in FIGS. 24 and 25 in that first semiconductor portion 4a is directly connected to first electrode 2a and that second semiconductor portion 4b is directly connected to second electrode 2b.

First semiconductor portion 4a extends from below opening 3a to the region located below first electrode 2a. Second semiconductor portion 4b extends from below opening 3a to the region located below second electrode 2b.

Step 40 is constituted by first semiconductor portion 4a and second semiconductor portion 4b. Step 40 does not include another semiconductor portion 4c. The portion located on the side of one side portion 42 in one bottom 41a, one side portion 42, and top 43 is constituted by first semiconductor portion 4a. The portion located on the side of the other side portion 42 in the other bottom 41a, the other side portion 42, and top 43 is constituted by second semiconductor portion 4b.

In insulating film 3, an additional opening is formed at positions that sandwich opening 3a and are located under first electrode 2a and second electrode 2b. First electrode 2a is directly connected to first semiconductor portion 4a inside the additional opening. Second electrode 2b is directly connected to second semiconductor portion 4b inside the additional opening.

Thus, the voltage can also be applied to two-dimensional material layer 1 while applying the voltage V between first semiconductor portion 4a and second semiconductor portion 4b. At this point, when a photodiode including first semiconductor portion 4a and second semiconductor portion 4b is in a saturated state in which the reverse bias is applied, the current flows through only two-dimensional material layer 1. Thus, the depletion layer is generated in first semiconductor portion 4a and second semiconductor portion 4b, and a large voltage change can be applied to two-dimensional material layer 1, so that the large photocurrent (photocarrier) can be taken out. Furthermore, in two-dimensional material layer 1, the conductivity of two-dimensional material layer 1 changes by affecting the influence of the change in the local electric field generated at junction portion 4ba that is the pn-junction interface between first semiconductor portion 4a and second semiconductor portion 4b. As a result, the detection sensitivity of the electromagnetic wave detector is improved.

When the tunnel diode including first semiconductor portion 4a and second semiconductor portion 4b is used, the large photocurrent is generated during only the light irradiation. The photocurrent is injected into two-dimensional material layer 1. Furthermore, the change in the conductivity due to the influence of the electric field change can be generated in two-dimensional material layer 1 during only the light irradiation. As a result, the sensitivity of the electromagnetic wave detector can be increased.

In the electromagnetic wave detector of the fifth embodiment, another semiconductor portion 4c and another electrode 2c may not be formed.

Figure 27:
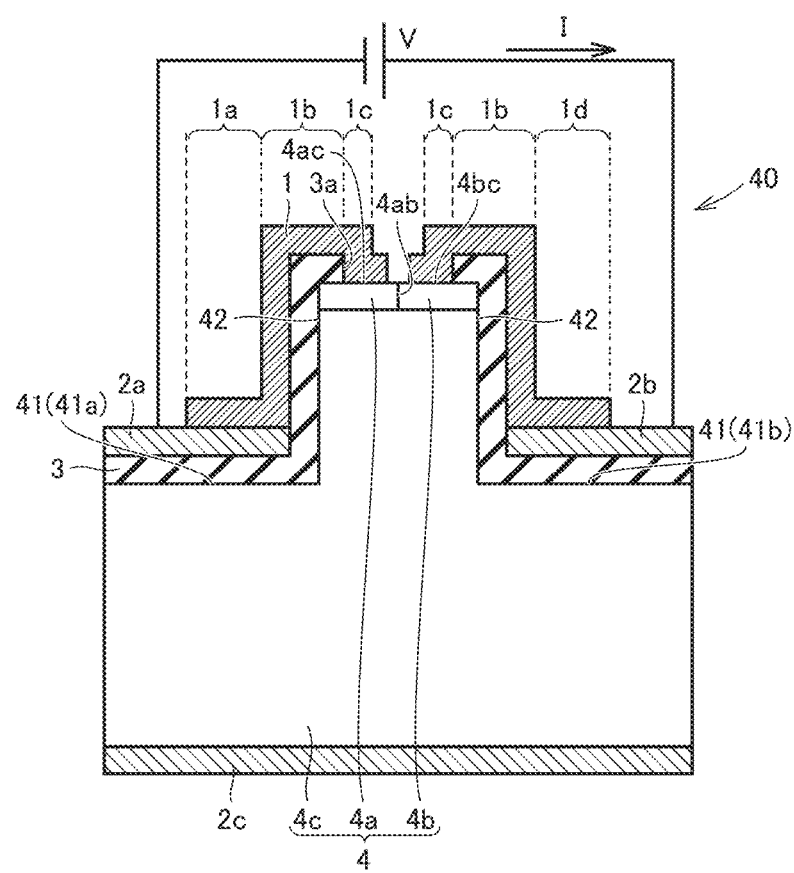
FIG. 27 is a schematic sectional view illustrating a second modification of the electromagnetic wave detector of the fifth embodiment.

An electromagnetic wave detector in FIG. 27 has the same configuration as the electromagnetic wave detector in FIGS. 24 and 25 and can obtain the same effect, but is different from the electromagnetic wave detector in FIGS. 24 and 25 in that region 1c of two-dimensional material layer 1 is divided between junction portion 4ac and junction portion 4bc. An electromagnetic wave detector in FIG. 28 has the same configuration as the electromagnetic wave detector in FIG. 26 and can obtain the same effect, but is different from the electromagnetic wave detector in FIG. 26 in that region 1c of two-dimensional material layer 1 is divided between junction portion 4ac and junction portion 4bc.

Figure 28:
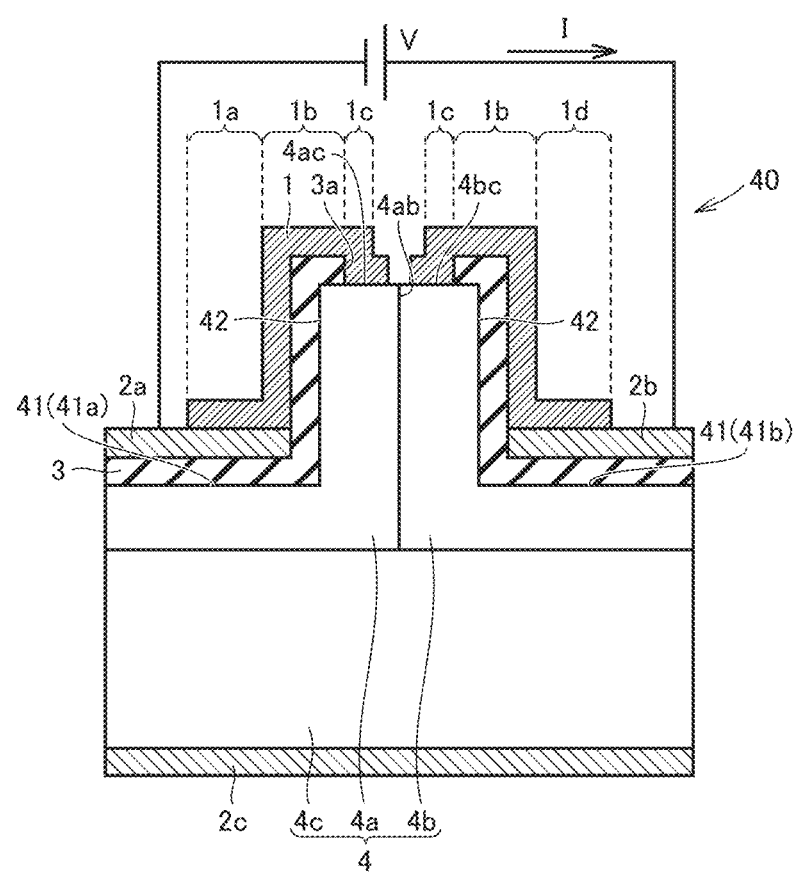
FIG. 28 is a schematic sectional view illustrating a third modification of the electromagnetic wave detector of the fifth embodiment.

In other words, region 1c of two-dimensional material layer 1 in FIGS. 27 and 28 is divided on junction interface 4ab. Region 1c of two-dimensional material layer 1 in FIGS. 27 and 28 has a first connection region in contact with first semiconductor portion 4a and a second connection region in contact with second semiconductor portion 4b. The first connection region and the second connection region are electrically connected through only pn-junction interface 4ab without through two-dimensional material layer 1.

Two-dimensional material layer 1 in FIGS. 27 and 28 includes a first two-dimensional material layer 1 including the first connection region electrically connected to first semiconductor portion 4a and a second two-dimensional material layer 1 including the second connection region electrically connected to second semiconductor portion 4b. First two-dimensional material layer 1 and second two-dimensional material layer 1 are constituted as separate members independent from each other. First two-dimensional material layer 1 and second two-dimensional material layer 1 are disposed so as to face each other across junction interface 4ab. First two-dimensional material layer 1 and second two-dimensional material layer 1 are divided on junction interface 4ab.

In the electromagnetic wave detector in FIGS. 27 and 28, current I flows sequentially through second electrode 2b, second two-dimensional material layer 1, junction portion 4bc, second semiconductor portion 4b, pn-junction interface 4ab, first semiconductor portion 4a, junction portion 4ac, first two-dimensional material layer 1, and first electrode 2a. Junction portion 4ac and junction portion 4bc are the Schottky junction portions where two-dimensional material layer 1 and first semiconductor portion 4a or second semiconductor portion 4b form the Schottky junction.

In such an electromagnetic wave detector, the reverse bias is applied to junction portion 4ac, so that the dark current is reduced.

When the material constituting first semiconductor portion 4a is different from the material constituting second semiconductor portion 4b, the change degree of the barrier height with respect to the voltage value (reverse bias) applied to the Schottky junction of junction portion 4ac is different from the change degree of the barrier height with respect to the voltage value (forward bias) applied to the Schottky junction of junction portion 4bc. When junction portion 4ac and junction portion 4bc are the Schottky junction portions, behaviors of the dark current and the photocurrent change according to the barrier height. Accordingly, in the electromagnetic wave detector of FIGS. 27 and 28, the temperature sensitivity can be improved because the rate of change in each of the dark current and the photocurrent can be freely adjusted by the voltage value.

The configurations of the electromagnetic wave detector of the fifth embodiment and the above-described modifications can also be applied to other embodiments.

Sixth Embodiment

Figure 29:
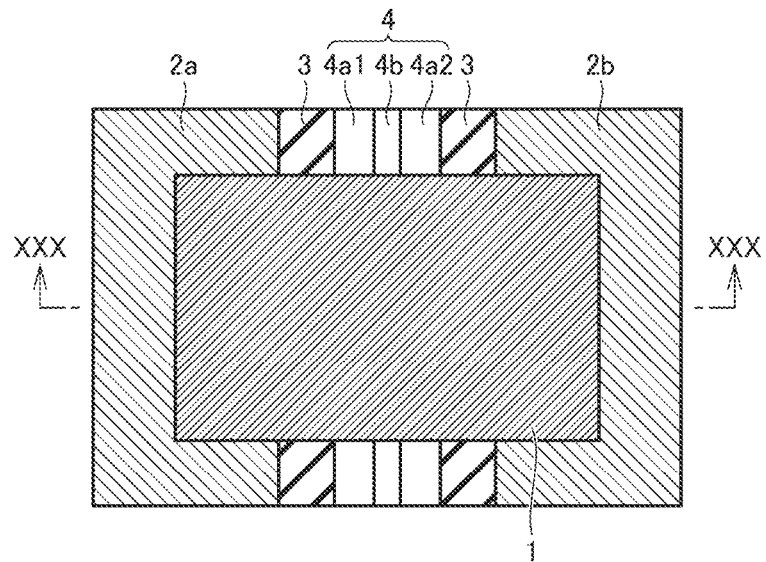
FIG. 29 is a schematic plan view illustrating an electromagnetic wave detector according to a sixth embodiment.
Figure 30:
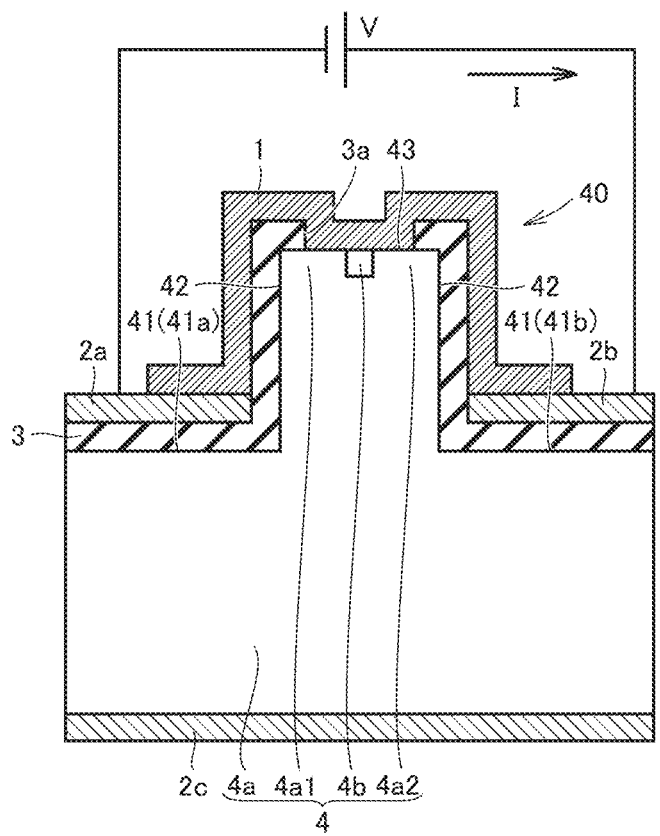
FIG. 30 is a schematic sectional view taken along a line XXX-XXX in FIG. 29.

FIG. 29 is a schematic plan view illustrating an electromagnetic wave detector according to a sixth embodiment. FIG. 30 is a schematic sectional view taken along a line XXX-XXX in FIG. 29. As illustrated in FIGS. 29 and 30, the electromagnetic wave detector of the sixth embodiment basically has the same configuration as the electromagnetic wave detector of the fifth embodiment and can obtain the same effect, but is different from the electromagnetic wave detector of the fifth embodiment in that first semiconductor portion 4a is disposed so as to sandwich at least a part of second semiconductor portion 4b when semiconductor layer 4 is viewed from opening 3a.

When semiconductor layer 4 is viewed from opening 3a, first semiconductor portion 4a includes a first portion 4a1 disposed on one side with respect to second semiconductor portion 4b in the lateral direction of opening 3a and a second portion 4a2 disposed on the other side with respect to second semiconductor portion 4b in the lateral direction of opening 3a. Inside opening 3a, second semiconductor portion 4b, first portion 4a1 of first semiconductor portion 4a, and second portion 4a2 of first semiconductor portion 4a are disposed so as to face two-dimensional material layer 1. Each of first portion 4a1 and second portion 4a2 is joined to second semiconductor portion 4b.

First portion 4a1 and second portion 4a2 of first semiconductor portion 4a, second semiconductor portion 4b, a pn-junction interface 4ab1 between first portion 4a1 and second semiconductor portion 4b, and an pn-junction interface 4ab2 between second portion 4a2 and second semiconductor portion 4b are exposed inside opening 3a.

Two-dimensional material layer 1 is connected to first portion 4a1 and second portion 4a2 of first semiconductor portion 4a, second semiconductor portion 4b, and pn-junction interface 4ab1 and pn-junction interface 4ab2 inside opening 3a.

The electromagnetic wave detector of the sixth embodiment can increase the pn-junction interface between first semiconductor portion 4a and second semiconductor portion 4b as compared with the electromagnetic wave detector of the fifth embodiment. Furthermore, the contact region between the pn-junction interface and two-dimensional material layer 1 is increased, so that the influence of the local electric field change generated at the pn-junction interface due to the light irradiation on two-dimensional material layer 1 can be increased. Furthermore, the contact region between the pn-junction interface and two-dimensional material layer 1 is increased, so that the influence of the local electric field change generated at the pn-junction interface due to the light irradiation on two-dimensional material layer 1 can be increased.

Modification

Second semiconductor portion 4b may be provided into a plurality of portions. That is, in opening 3a, the plurality of second semiconductor portions 4b may be disposed at intervals in first semiconductor portion 4a. As a result, the pn-junction interface between first semiconductor portion 4a and second semiconductor portion 4b can be further increased. Furthermore, the contact region between the pn-junction interface and the two-dimensional material layer 1 is further increased, so that the influence of the local electric field change generated at the pn-junction interface due to the light irradiation on two-dimensional material layer 1 can be increased.

Figure 31:
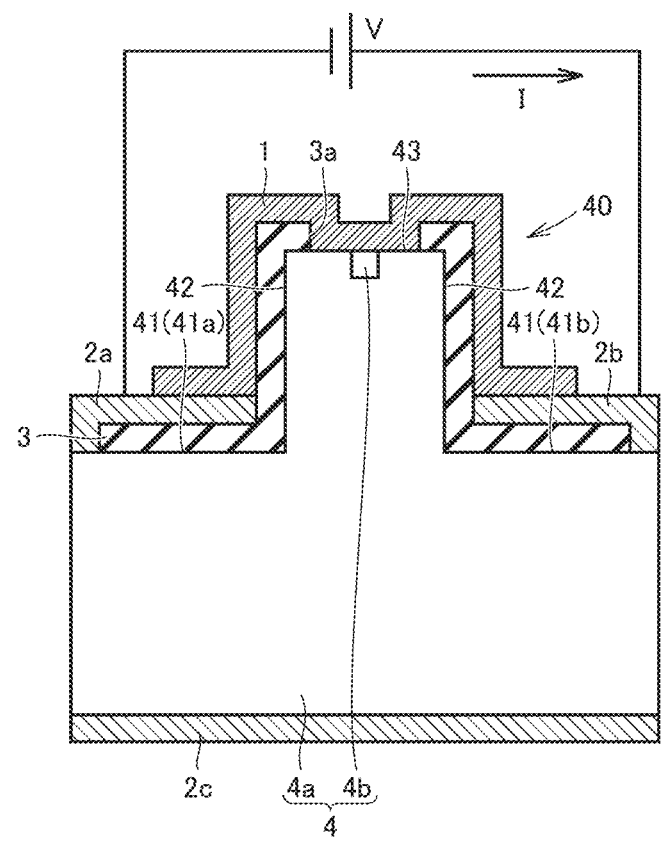
FIG. 31 is a schematic sectional view illustrating a first modification of the electromagnetic wave detector of the sixth embodiment.

In addition, first semiconductor portion 4a and second semiconductor portion 4b may be pnp- or npn-phototransistors. For example, as illustrated in FIG. 31, first electrode 2a may be brought into contact with first semiconductor portion 4a. The electromagnetic wave detector in FIG. 31 basically has the same configuration as the electromagnetic wave detector in FIGS. 29 and 30 and can obtain the same effect, and is different from the electromagnetic wave detector in FIGS. 29 and 30 in that the constitutions of insulating film 3, first electrode 2a, and electrode 2c. That is, in the electromagnetic wave detector of FIG. 31, first electrode 2a and first semiconductor portion 4a are in contact with each other. Furthermore, electrode 2c and first semiconductor portion 4a are also in contact with each other. In insulating film 3, an additional opening is formed at the positions that sandwich opening 3a and are positioned under first electrode 2a and electrode 2c. First electrode 2a and electrode 2c extend inside the additional opening. Inside the additional opening, first electrode 2a and electrode 2c are connected to first semiconductor portion 4a.

With such a configuration, the current flows through the transistor including first semiconductor portion 4a and second semiconductor portion 4b during only the light irradiation. As a result, the electric field change can be generated in two-dimensional material layer 1, and the sensitivity of the electromagnetic wave detector can be increased.

Seventh Embodiment

Figure 32:
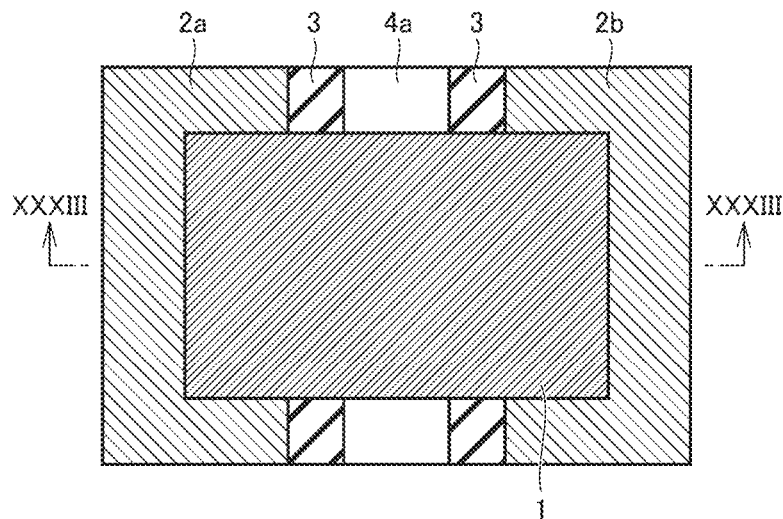
FIG. 32 is a schematic plan view illustrating an electromagnetic wave detector according to a seventh embodiment.
Figure 33:
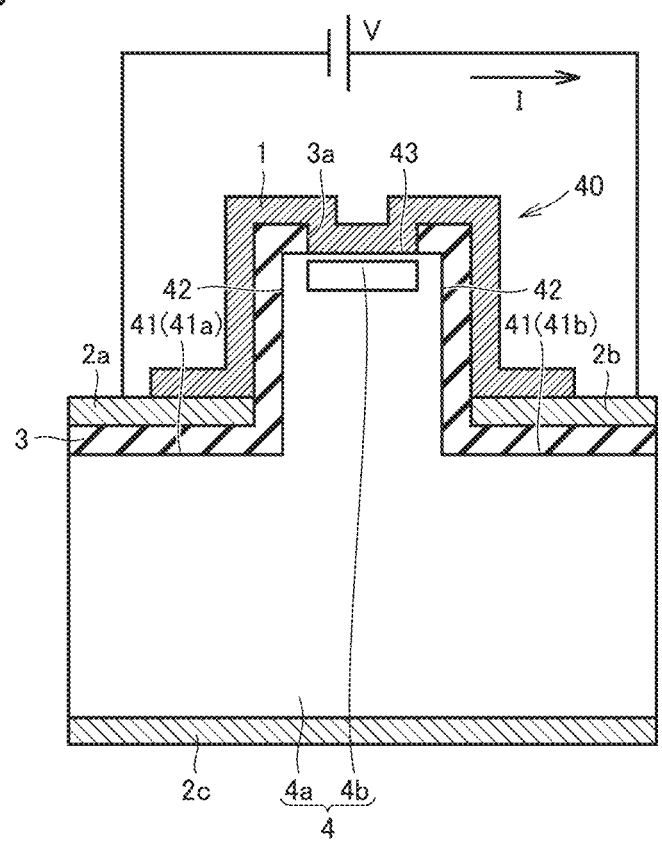
FIG. 33 is a schematic sectional view taken along a line XXXIII-XXXIII in FIG. 32.

FIG. 32 is a schematic plan view illustrating an electromagnetic wave detector according to a seventh embodiment. FIG. 33 is a schematic sectional view taken along a line XXXIII-XXXIII in FIG. 32. As illustrated in FIGS. 32 and 33, the electromagnetic wave detector of the seventh embodiment has a configuration basically similar to that of the electromagnetic wave detector of the fifth embodiment and can obtain similar effects. However, the electromagnetic wave detector of the seventh embodiment is different from the electromagnetic wave detector of the fifth embodiment in that second semiconductor portion 4b is embedded in first semiconductor portion 4a.

Second semiconductor portion 4b is disposed below opening 3a. Second semiconductor portion 4b is embedded under first semiconductor portion 4a connected to two-dimensional material layer 1 inside opening 3a. For example, inside step 40, second semiconductor portion 4b is disposed below top 43 and above bottom 41. First semiconductor portion 4a is disposed between top 43 and second semiconductor portion 4b. In other words, thin first semiconductor portion 4a is disposed between two-dimensional material layer 1 and second semiconductor portion 4b. The thickness of first semiconductor portion 4a located between top 43 and second semiconductor portion 4b is thinner than the thickness of second semiconductor portion 4b.

The pn-junction is formed by first semiconductor portion 4a and second semiconductor portion 4b. As a result, the pn-junction is formed immediately below two-dimensional material layer 1 located inside opening 3a. Accordingly, the extraction efficiency of the photocurrent from semiconductor layer 4 to two-dimensional material layer 1 is improved. Furthermore, the change in the electric field given by semiconductor layer 4 to two-dimensional material layer 1 increases, so that the sensitivity of the electromagnetic wave detector can be increased.

In this way, as illustrated in FIG. 33, the pn-junction is formed at the junction interface between first semiconductor portion 4a and second semiconductor portion 4b to form the diode. When the diode is irradiated with electromagnetic waves (light), deactivation of the photocarriers generated at the junction interface between first semiconductor portion 4a and second semiconductor portion 4b decreases, and the photocurrent injected into two-dimensional material layer 1 increases. As a result, the electromagnetic wave detector having the high sensitivity can be obtained.

In the electromagnetic wave detector of the seventh embodiment, another semiconductor portion 4c and another electrode 2c may not be formed.

The configuration of the electromagnetic wave detector of the seventh embodiment can also be applied to other embodiments.

Eighth Embodiment

Figure 34:
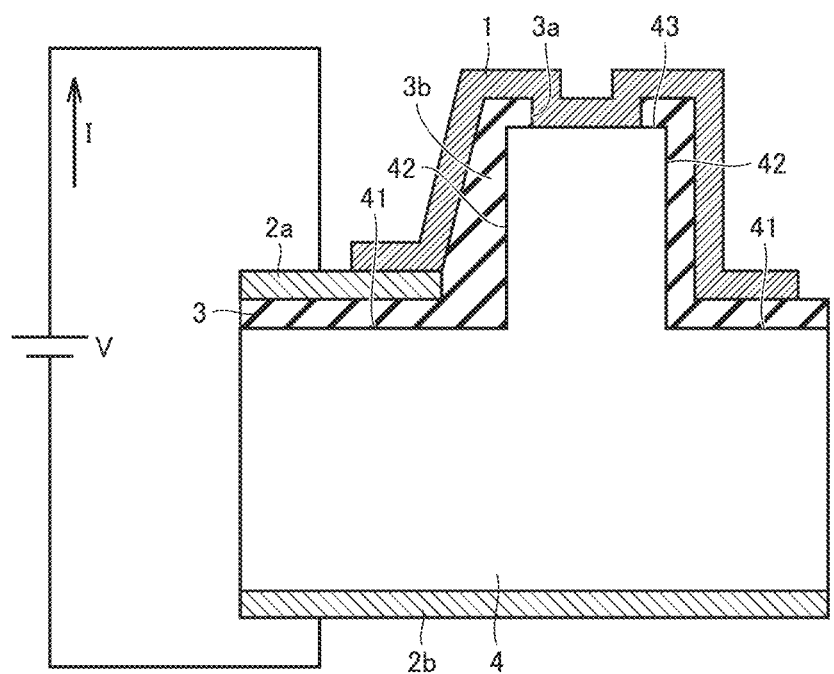
FIG. 34 is a schematic sectional view illustrating an electromagnetic wave detector according to an eighth embodiment.

FIG. 34 is a schematic plan view illustrating an electromagnetic wave detector according to an eighth embodiment. As illustrated in FIG. 34, the electromagnetic wave detector of the eighth embodiment has a configuration basically similar to that of the electromagnetic wave detector of the first embodiment and can obtain similar effects. However, the electromagnetic wave detector of the eighth embodiment is different from the electromagnetic wave detector of the first embodiment in that a tapered portion 3b in which the thickness of insulating film 3 gradually decreases from first electrode 2a toward opening 3a is formed in insulating film 3.

As illustrated in FIG. 34, tapered portion 3b in which the surface of insulating film 3 is inclined with respect to side portion 42 is formed between first electrode 2a and opening 3a of insulating film 3. An angle formed between the surface of tapered portion 3b and the surface of first semiconductor portion 4a may be an acute angle, and for example, may be less than or equal to 45° or less than or equal to 30°. For example, the surface of the tapered portion 3b is a flat surface, but may be a curved surface. Tapered portion 3b can be formed by any method. For example, tapered portion 3b may be formed by inclining semiconductor layer 4 to form the insulating film. Alternatively, tapered portion 3b may be formed by dry etching of insulating film 3 previously formed on semiconductor layer 4 in the state where semiconductor layer 4 is inclined.

In the electromagnetic wave detector of the eighth embodiment, because insulating film 3 is provided with the gradient in tapered portion 3b, a local change is generated in the degree of electric field change in two-dimensional material layer 1 when semiconductor layer 4 is irradiated with the electromagnetic wave. That is, when semiconductor layer 4 is irradiated with the electromagnetic wave to apply the electric field change to two-dimensional material layer 1, the degree of the electric field change locally changes according to the change in the thickness of insulating film 3. Accordingly, the carrier mobility in two-dimensional material layer 1 is improved, and the detection sensitivity of the electromagnetic wave detector is improved.

The configuration of the electromagnetic wave detector of the eighth embodiment can also be applied to other embodiments.

Ninth Embodiment

<Constitution of Electromagnetic Wave Detector>

Figure 35:
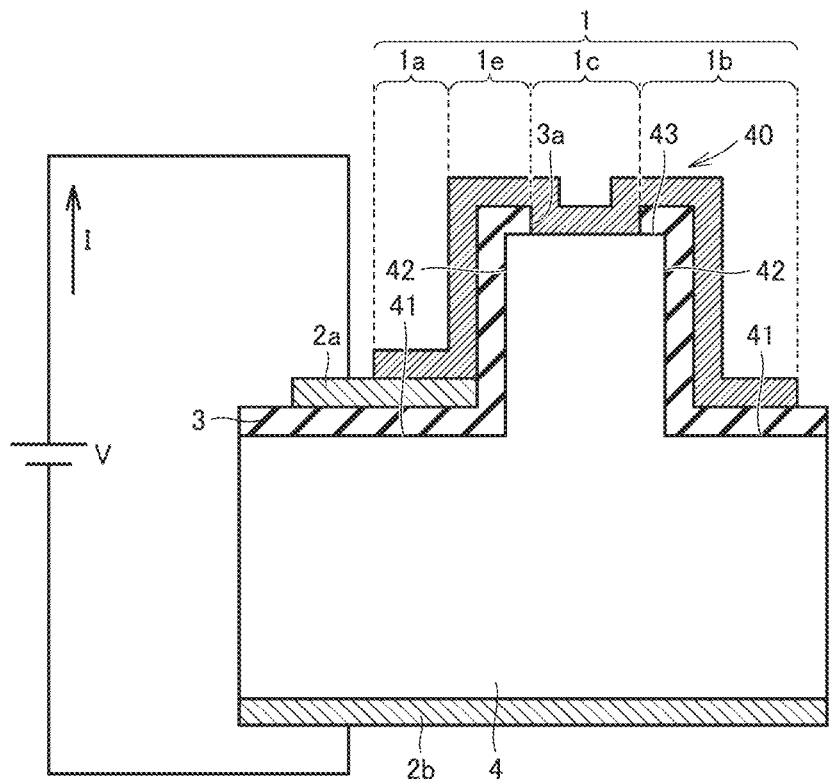
FIG. 35 is a schematic sectional view illustrating an electromagnetic wave detector according to a ninth embodiment.

FIG. 35 is a sectional view illustrating an electromagnetic wave detector according to a ninth embodiment. As illustrated in FIG. 35, the electromagnetic wave detector of the ninth embodiment has a configuration basically similar to that of the electromagnetic wave detector of the first embodiment and can obtain similar effects. However, the electromagnetic wave detector of the ninth embodiment is different from the electromagnetic wave detector of the first embodiment in that two-dimensional material layer 1 includes a turbostratic structure portion 1e.

As illustrated in FIG. 35, the region corresponding to the channel region in two-dimensional material layer 1 is turbostratic structure portion 1e. At this point, turbostratic structure portion 1e is the region where a plurality of graphene layers are laminated, and means the structure in which lattices of the laminated graphenes are laminated while are not matched with each other. Entire two-dimensional material layer 1 may have a turbo stratic structure, or only turbostratic structure portion 1e may have the turbostratic structure.

A method for producing turbostratic structure portion 1e may be any method. For example, turbostratic structure portion 1e can be formed by transferring a plurality of monolayer graphene produced by a CVD method and laminating multilayered graphene. In addition, for example, turbostratic structure portion 1e can be formed by growing the graphene on the graphene by the CVD method using ethanol, methane, or the like as a carbon source.

In the electromagnetic wave detector in FIG. 35, the portion corresponding to the channel region in two-dimensional material layer 1 is turbostratic structure portion 1e, so that the carrier mobility in two-dimensional material layer 1 is improved. At this point, the normal laminated graphene is called A-B lamination, and is laminated in the state where lattices of the laminated graphenes are matched with each other. However, the graphene produced by the CVD method is polycrystalline, and the turbostratic structure in which the lattices of the laminated graphenes are mismatched is obtained in the case where a plurality of graphenes are further transferred on the graphene or in the case where the graphene is laminated on the underlying graphene by the CVD method.

The graphene having the turbostratic structure constituting turbostratic structure portion 1e has little influence of interlayer interaction and has property equivalent to that of the monolayer graphene. Furthermore, the mobility of two-dimensional material layer 1 decreases due to the influence of carrier scattering in underlying insulating film 3. However, in turbostratic structure portion 1e, the graphene in contact with insulating film 3 is affected by the carrier scattering, but the upper graphene laminated on the graphene in the turbostratic structure is less likely to be affected by the carrier scattering of underlying insulating film 3. In addition, in the graphene having the turbostratic structure, the influence of interaction between layers is small, and thus the conductivity is also improved. As described above, the carrier mobility can be improved in the graphene having the turbostratic structure. As a result, the sensitivity of the electromagnetic wave detector can be improved.

In addition, the graphene having the turbostratic structure may be applied to only the portion of two-dimensional material layer 1 existing on insulating film 3. For example, the graphene that is not the turbostratic structure, for example, the monolayer graphene may be used for region 1a in two-dimensional material layer 1. In this case, the influence of the carrier scattering of insulating film 3 on two-dimensional material layer 1 can be prevented without increasing the contact resistance between first electrode 2a and first semiconductor portion 4a and two-dimensional material layer 1.

The constitution of the electromagnetic wave detector of the ninth embodiment can also be applied to other embodiments.

Tenth Embodiment

Figure 36:
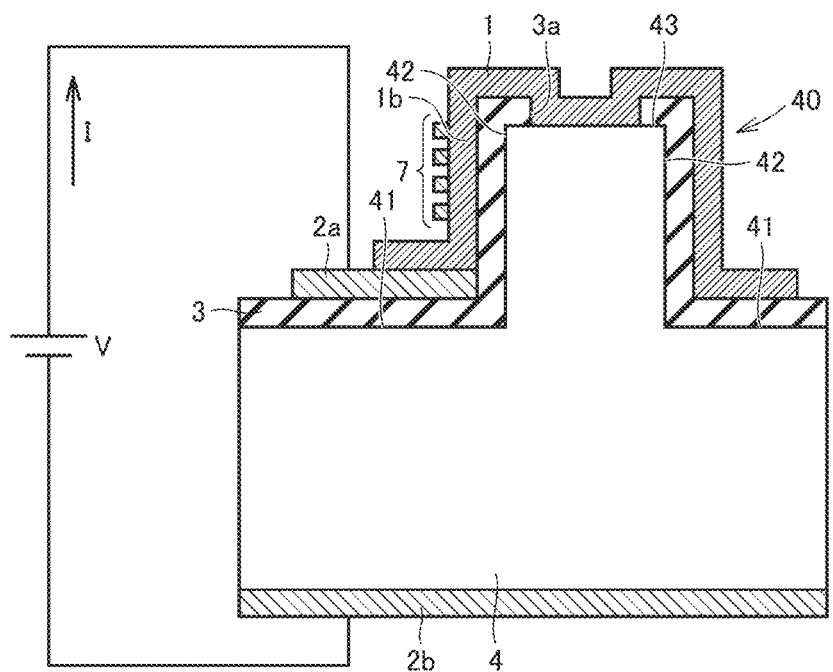
FIG. 36 is a schematic sectional view illustrating an electromagnetic wave detector according to a tenth embodiment.

FIG. 36 is a schematic sectional view illustrating an electromagnetic wave detector according to a tenth embodiment.

As illustrated in FIG. 36, the electromagnetic wave detector of the tenth embodiment has a configuration basically similar to that of the electromagnetic wave detector of the first embodiment and can obtain a similar effect, and is different from the electromagnetic wave detector of the first embodiment in that the electromagnetic wave detector of the tenth embodiment further includes at least one conductor 7 disposed so as to be in contact with two-dimensional material layer 1.

In the electromagnetic wave detector illustrated in FIG. 36, the plurality of conductors 7 are arranged so as to be in contact with the region 1b of the two-dimensional material layer 1. The plurality of conductors 7 are disposed at intervals. For example the plurality of conductors 7 are disposed on side portion 42 of step 40. The conductor 7 is a floating electrode. The details will be described below.

As illustrated in FIG. 36, the electromagnetic wave detector of the tenth embodiment includes the plurality of conductors 7 as floating electrodes on two-dimensional material layer 1. The material constituting each conductor 7 may be any material having the conductivity, and for example, includes at least one selected from the group consisting of gold (Au), silver (Ag), copper (Cu), aluminum (Al), nickel (Ni), chromium (Cr), and palladium (Pd). Each conductor 7 is not connected to the power supply circuit or the like, but is floating.

The plurality of conductors 7 are provided on region 1b of two-dimensional material layer 1 located between first electrode 2a and first semiconductor portion 4a. The plurality of conductors 7 has a one-dimensional or two-dimensional periodic structure. For example, a structure in which the plurality of conductors 7 are arranged at intervals (periodically) in the horizontal direction on the paper surface of FIG. 36 or in the depth direction on the paper surface can be adopted as an example of the one-dimensional periodic structure. Furthermore, a structure in which conductors 7 are arranged at positions corresponding to lattice points such as a square lattice or a triangular lattice in a plan view of the electromagnetic wave detector can be adopted as an example of the two-dimensional periodic structure. In a plan view of the electromagnetic wave detector, the planar shape of each conductor 7 may be any shape such as a circular shape, a triangular shape, a quadrangular shape, a polygonal shape, or an elliptical shape. In addition, the arrangement of conductors 7 in a plan view is not limited to the above-described arrangement having periodic symmetry, but may be the arrangement having asymmetry in a plan view. At this point, any method can be adopted as a specific method for forming conductor 7, and for example, a method similar to the method of manufacturing first electrode 2a described in the first embodiment may be used.

In the electromagnetic wave detector of the tenth embodiment, conductor 7 that is the floating electrode is provided on two-dimensional material layer 1 corresponding to the channel region. For this reason, the photocarrier generated by the irradiation with the electromagnetic wave in semiconductor layer 4 can move back and forth between the plurality of conductors 7, and as a result, a lifetime of the photocarrier becomes long. Accordingly, the sensitivity of the electromagnetic wave detector can be enhanced.

In addition, when the plurality of conductors 7 are arranged to form the one-dimensional periodic structure, and the material that causes the surface plasmon resonance is used for the material of conductor 7, polarization dependency is generated in conductor 7 by the irradiated electromagnetic wave. As a result, semiconductor layer 4 of the electromagnetic wave detector can be irradiated with only the electromagnetic wave having the specific polarization. In this case, the electromagnetic wave detector of the tenth embodiment can detect only the specific polarized light.

In addition, the plurality of conductors 7 are arranged so as to form the two-dimensional periodic structure, and the material of conductor 7 is used as the material that causes the surface plasmon resonance, so that the electromagnetic wave having the specific wavelength can be resonated by the plurality of conductors 7. In this case, only the electromagnetic wave having the specific wavelength can be detected by the electromagnetic wave detector. In this case, the electromagnetic wave detector of the tenth embodiment can detect only the electromagnetic wave having the specific wavelength with high sensitivity.

In addition, in the case where the plurality of conductors 7 are formed so as to be asymmetrically arranged in a plan view, the polarization dependency is generated in conductor 7 with respect to the irradiated electromagnetic wave similarly to the case where the plurality of conductors 7 have the one-dimensional periodic structure. As a result, semiconductor layer 4 can be irradiated with only the electromagnetic wave having the specific polarization. In this case, the electromagnetic wave detector of the tenth embodiment can detect only the specific polarized light.

Modification

Figure 37:
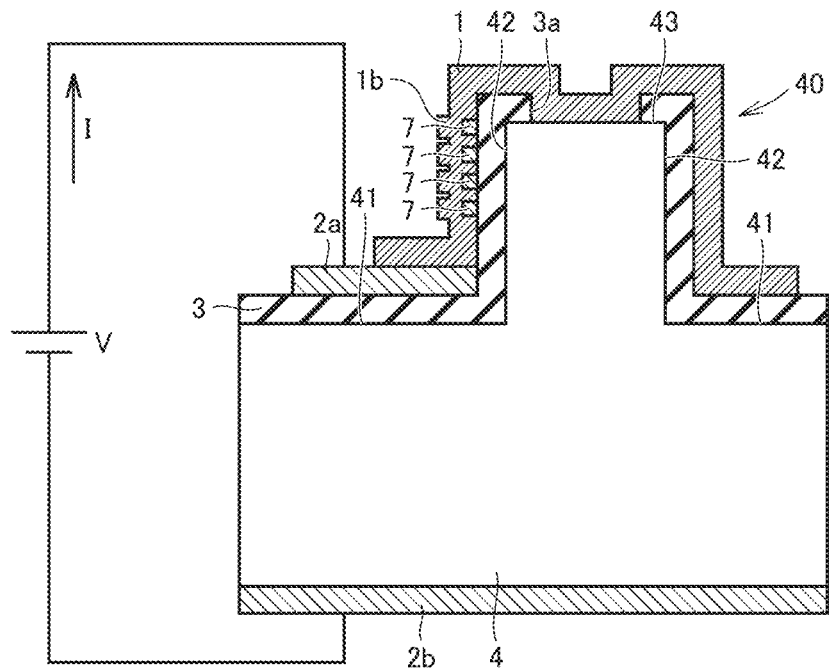
FIG. 37 is a schematic sectional view illustrating a modification of the electromagnetic wave detector of the tenth embodiment.

An electromagnetic wave detector in FIG. 37 has the constitution basically similar to that of the electromagnetic wave detector in FIG. 36 and can obtain a similar effect, but is different from the electromagnetic wave detector in FIG. 36 in that conductor 7 is disposed under two-dimensional material layer 1. That is, in the electromagnetic wave detector of FIG. 37, the plurality of conductors 7 are disposed between the lower surface of two-dimensional material layer 1 and the upper surface of insulating film 3. Two-dimensional material layer 1 has a plurality of bent portions (uneven portions) along the surfaces of the plurality of conductors 7. Even with such a constitution, the same effect as that of the electromagnetic wave detector in FIG. 36 can be obtained. Furthermore, in this case, two-dimensional material layer 1 is not damaged during the formation of conductor 7, so that the decrease in the carrier mobility in two-dimensional material layer 1 can be prevented.

In addition, the uneven portion may be formed in the region of two-dimensional material layer 1 corresponding to the channel region. In this case, the uneven portion of two-dimensional material layer 1 may have the periodic structure or the asymmetric structure similarly to the plurality of conductors 7 described above. In this case, the same effect as the case of forming the plurality of conductors 7 can be obtained.

Although conductors 7 in FIGS. 36 and 37 are formed only on side portion 42, conductor 7 may be formed on at least one of top 43, side portion 42, and bottom 41 as long as conductor 7 is in contact with region 1b.

Each of the electromagnetic wave detectors in FIGS. 36 and 37 includes the plurality of conductors 7, and may include only one conductor 7.

The constitutions of the electromagnetic wave detectors of the tenth embodiment and the above modification can also be applied to other embodiments.

Eleventh Embodiment

Figure 38:
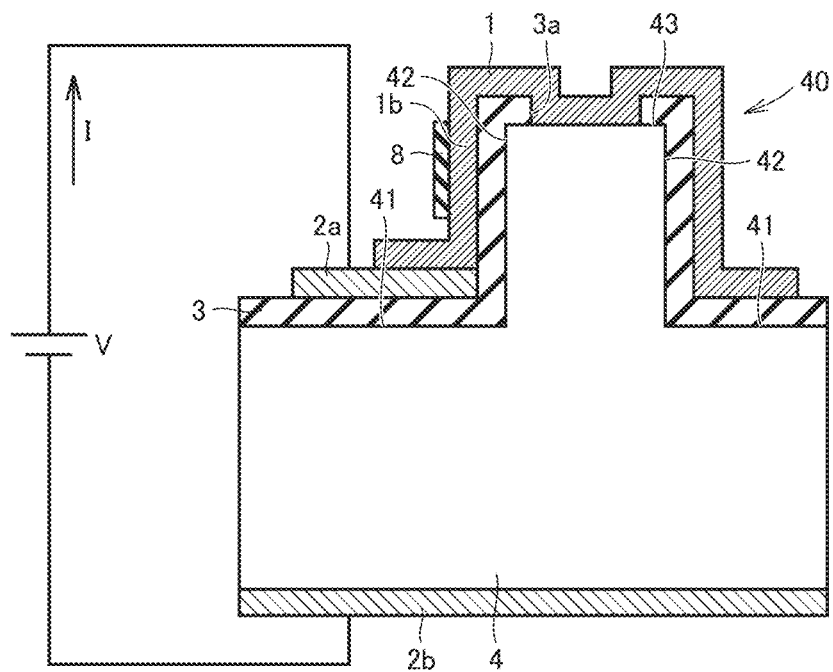
FIG. 38 is a schematic sectional view illustrating an electromagnetic wave detector according to an eleventh embodiment.

FIG. 38 is a schematic sectional view illustrating an electromagnetic wave detector according to an eleventh embodiment. As illustrated in FIG. 38, the electromagnetic wave detector of the eleventh embodiment has a constitution basically similar to that of the electromagnetic wave detector of the first embodiment and can obtain a similar effect, but is different from the electromagnetic wave detector of the first embodiment in that the electromagnetic wave detector of the eleventh embodiment further includes at least one contact layer 8 disposed in contact with the two-dimensional material layer 1.

In the electromagnetic wave detector in FIG. 38, contact layer 8 is disposed on region 1b of two-dimensional material layer 1. Contact layer 8 is provided such that the holes or electrons are supplied to two-dimensional material layer 1 while contact layer 8 is in contact with two-dimensional material layer 1.

For example, the material constituting contact layer 8 is a composition called positive photoresist containing a photosensitizer having a quinonediazide group and a novolac resin. In addition, for example, the material constituting contact layer 8 may be a material having a polar group, and more specifically, may be a material having an electron withdrawing group that is an example of the material having the polar group. The material having the electron withdrawing group has an effect of decreasing the electron density of two-dimensional material layer 1. In addition, for example, the material constituting contact layer 8 may be a material having an electron donating group that is an example of the material having the polar group. The material having the electron donating group has an effect of increasing the electron density of two-dimensional material layer 1.

Examples of the material having the electron withdrawing group include materials having a halogen, a nitrile, a carboxyl group, a carbonyl group, or the like. Examples of the material having the electron donating group include materials having an alkyl group, an alcohol, an amino group, a hydroxyl group, or the like. The material constituting contact layer 8 may be a material in which the charge bias is generated in the entire molecule by the polar group other than the electron withdrawing group and the electron donating group.

In addition, the material constituting contact layer 8 may be an organic substance, a metal, a semiconductor, an insulator, a two-dimensional material, or a mixture of any of these materials as long as the charge bias is generated in the entire molecule to produce the polarity.

When the material constituting contact layer 8 is the inorganic substance, the conductivity type with which two-dimensional material layer 1 in contact with contact layer 8 is doped is the p-type when the work function of contact layer 8 is larger than the work function of two-dimensional material layer 1, and is the n-type when the work function of contact layer 8 is smaller than the work function of two-dimensional material layer 1. On the other hand, when the material constituting contact layer 8 is the organic substance, the organic substance that is the material constituting contact layer 8 does not have the clear work function. For this reason, whether the doped conductivity type of two-dimensional material layer 1 is the p-type or the n-type is preferably determined by determining the polar group of the material of contact layer 8 based on the polarity of the organic molecule used for contact layer 8.

For example, when the composition called the positive photoresist containing the photosensitizer having the quinonediazide group and the novolac resin is used as contact layer 8, the region where the resist is formed by the photolithography process in two-dimensional material layer 1 becomes the p-type two-dimensional material layer region. This eliminates the need for a mask forming process for making contact with the surface of two-dimensional material layer 1. As a result, the reduction of process damage to two-dimensional material layer 1 and simplification of the process can be performed.

In the electromagnetic wave detector of the eleventh embodiment, contact layer 8 is formed on two-dimensional material layer 1. As described above, for example, the material having the electron withdrawing group or the material having the electron donating group is used as the material of contact layer 8, so that the state (conductivity type) of two-dimensional material layer 1 can be intentionally set to the n-type or the p-type. In this case, the carrier doping of two-dimensional material layer 1 can be controlled without considering the influence of the carrier doping from first electrode 2a and first semiconductor portion 4a to two-dimensional material layer 1. As a result, the performance of the electromagnetic wave detector can be improved.

Contact layer 8 is formed on only one of the side of first electrode 2a and the side of first semiconductor portion 4a on the upper surface of two-dimensional material layer 1, so that the gradient of the charge density is formed in two-dimensional material layer 1. As a result, the carrier mobility is improved in two-dimensional material layer 1, and the sensitivity of the electromagnetic wave detector can be increased.

In the electromagnetic wave detector of the eleventh embodiment, the film thickness of contact layer 8 is preferably sufficiently thin such that photoelectric conversion can be performed when two-dimensional material layer 1 is irradiated with the electromagnetic wave. On the other hand, preferably contact layer 8 is formed so as to have the thickness that allows the carriers to be doped from contact layer 8 into two-dimensional material layer 1. Contact layer 8 may have any constitution as long as the carriers such as molecules or electrons are introduced into two-dimensional material layer 1. For example, two-dimensional material layer 1 is immersed in a solution to supply the carriers to two-dimensional material layer 1 at a molecular level, so that the carriers may be doped into two-dimensional material layer 1 without forming solid contact layer 8 on two-dimensional material layer 1.

In addition to the above-described materials, a material that causes polarity conversion may be used as the material of contact layer 8. In this case, when contact layer 8 performs the polarity conversion, the electrons or the holes generated during the conversion are supplied to two-dimensional material layer 1. For this reason, doping of the electrons or the holes is generated in the portion of two-dimensional material layer 1 with which contact layer 8 is in contact. Accordingly, even when contact layer 8 is removed, the doped electrons or holes remain in the relevant portion of two-dimensional material layer 1 in contact with contact layer 8. Consequently, when the material that causes the polarity conversion is used as contact layer 8, contact layer 8 may be removed from two-dimensional material layer 1 after a certain time elapses.

In this case, the opening area of two-dimensional material layer 1 increases as compared with the case where contact layer 8 exists. Accordingly, the detection sensitivity of the electromagnetic wave detector can be improved. At this point, the polar conversion is the phenomenon in which the polar group is chemically converted, and for example, means the phenomenon in which the electron withdrawing group is changed to the electron donating group, the electron donating group is changed to the electron withdrawing group, the polar group is changed to a nonpolar group, or the nonpolar group is changed to the polar group.

In addition, contact layer 8 may be formed of a material that causes the polarity conversion by the electromagnetic wave irradiation. In this case, the material that causes the polarity conversion at the wavelength of the specific electromagnetic wave is selected as the material of contact layer 8, so that two-dimensional material layer 1 can be doped by causing the polarity conversion in contact layer 8 during only the electromagnetic wave irradiation of the wavelength of the specific electromagnetic wave. As a result, the photocurrent flowing into two-dimensional material layer 1 can be increased.

In addition, a material that causes an oxidation-reduction reaction by electromagnetic wave irradiation may be used as the material of contact layer 8. In this case, two-dimensional material layer 1 can be doped with the electrons or holes generated during the oxidation-reduction reaction.

The electromagnetic wave detector includes contact layer 8 in contact with two-dimensional material layer 1. Contact layer 8 supplies the holes or the electrons to two-dimensional material layer 1. In this case, the carrier doping of two-dimensional material layer 1 can be controlled without considering the influence of the carrier doping from first electrode 2a and first semiconductor portion 4a. As a result, the performance of the electromagnetic wave detector can be improved.

Although contact layer 8 in FIG. 38 is formed only on the side portion, contact layer 8 may be formed on at least one of top 43, side portion 42, and bottom 41.

The configurations of the electromagnetic wave detector of the eleventh embodiment and the above modifications can also be applied to other embodiments.

Twelfth Embodiment

Figure 39:
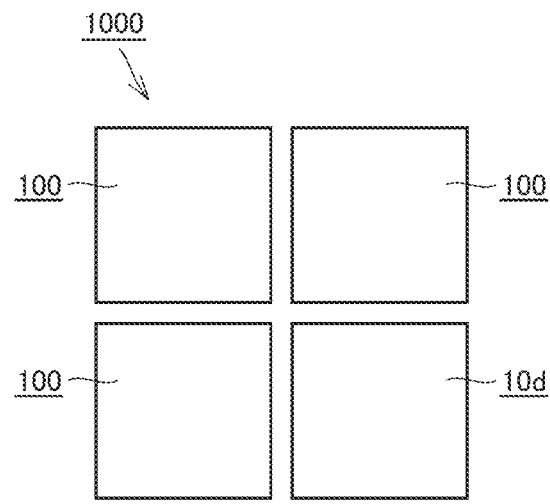
FIG. 39 is a schematic plan view illustrating an electromagnetic wave detector according to a twelfth embodiment.

FIG. 39 is a schematic plan view illustrating an electromagnetic wave detector assembly according to a twelfth embodiment.

As illustrated in FIG. 39, an electromagnetic wave detector assembly 1000 of the twelfth embodiment is an assembly of a plurality of electromagnetic wave detectors 100. Electromagnetic wave detector assembly 1000 includes the plurality of electromagnetic wave detectors 100 of any one of the first to eleventh embodiments as a detection element. For example, electromagnetic wave detector assembly 1000 includes the electromagnetic wave detector of the first embodiment as electromagnetic wave detector 100.

In electromagnetic wave detector assembly 1000, detection wavelengths of the plurality of electromagnetic wave detectors 100 are equal to each other. As illustrated in FIG. 39, in electromagnetic wave detector assembly 1000, the plurality of electromagnetic wave detectors 100 are arranged in an array in a two-dimensional direction. In other words, the plurality of electromagnetic wave detectors 100 are arranged in a first direction and a second direction intersecting the first direction. In electromagnetic wave detector assembly 1000 of FIG. 39, four electromagnetic wave detectors 100 are arranged in a 2×2 array. However, the number of arranged electromagnetic wave detectors 100 are not limited thereto. For example, the plurality of electromagnetic wave detectors 100 may be arranged in an array of 3 or more×3 or more.

In electromagnetic wave detector assembly 1000 of FIG. 39, the plurality of electromagnetic wave detectors 100 are two-dimensionally and periodically arrayed, but the plurality of electromagnetic wave detectors 100 may be periodically arrayed along one direction. Each interval of the plurality of electromagnetic wave detectors 100 may be equal or different.

When the plurality of electromagnetic wave detectors 100 are arranged in the array, second electrode 2b may be a common electrode as long as each electromagnetic wave detector 100 can be separated. As compared with the constitution in which second electrode 2b is independent in each electromagnetic wave detector 100, the number of wirings of pixels can be decreased using second electrode 2b as the common electrode. As a result, resolution of the electromagnetic wave detector assembly can be increased.

As a method for separating electromagnetic wave detectors 100 from each other, for example, current interruption structure 5 such as the trench structure described in the second embodiment may be provided on the outer periphery of electromagnetic wave detector 100.

As described above, electromagnetic wave detector assembly 1000 using the plurality of electromagnetic wave detectors 100 can also be used as an image sensor by arranging the plurality of electromagnetic wave detectors 100 in the array.

Electromagnetic wave detector assembly 1000 may include any one of the electromagnetic wave detectors of the second to eleventh embodiments as electromagnetic wave detector 100. Electromagnetic wave detector assembly 1000 may include any one of the electromagnetic wave detectors of the second to eleventh embodiments as electromagnetic wave detector 100.

Electromagnetic wave detector assembly 1000 may include a plurality of electromagnetic wave detectors of any one of the first to eleventh embodiments, or include a plurality of electromagnetic wave detectors according to at least two of the first to eleventh embodiments.

Modification

Figure 40:
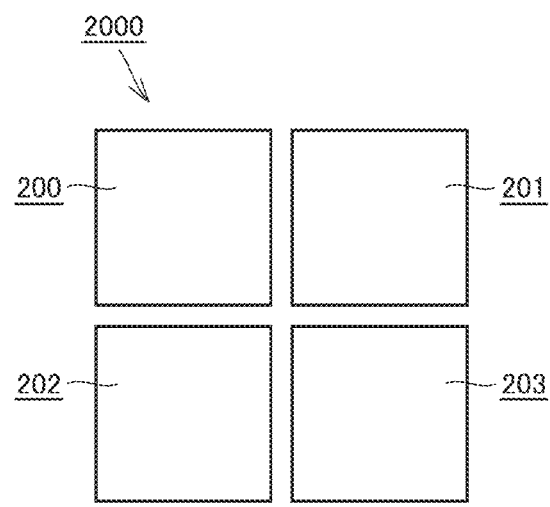
FIG. 40 is a schematic sectional view illustrating a modification of the electromagnetic wave detector of the twelfth embodiment.

An electromagnetic wave detector assembly 2000 in FIG. 40 has a constitution basically similar to that of electromagnetic wave detector assembly 1000 in FIG. 39 and can obtain a similar effect, but is different from the electromagnetic wave detector assembly in FIG. 39 in that electromagnetic wave detector assembly 2000 in FIG. 40 includes different type electromagnetic wave detectors 200, 201, 202, 203 as the plurality of electromagnetic wave detectors. That is, in electromagnetic wave detector assembly 2000 of FIG. 40, different type electromagnetic wave detectors 200, 201, 202, 203 are arranged in the array (matrix).

In electromagnetic wave detector assembly 2000 of FIG. 40, electromagnetic wave detectors 200, 201, 202, 203 are arranged in a 2×2 matrix. However, the number of arranged electromagnetic wave detectors is not limited thereto. In the electromagnetic wave detector assembly 2000 of FIG. 40, the plurality of electromagnetic wave detectors 200, 201, 202, 203 are two-dimensionally and periodically arrayed, but the plurality of electromagnetic wave detectors 200, 201, 202, 203 may be periodically arrayed along one direction. Each interval of the plurality of electromagnetic wave detectors 200, 201, 202, 203 may be equal or different.

In electromagnetic wave detector assembly 2000 of FIG. 40, different type electromagnetic wave detectors 200, 201, 202, 203 of any one of the first to eleventh embodiments are arranged in the one-dimensional or two-dimensional array, so that the function as the image sensor can be provided.

For example, electromagnetic wave detectors 200, 201, 202, 203 are the electromagnetic wave detector having detection wavelengths different from each other. Specifically, electromagnetic wave detectors 200, 201, 202, 203 are the electromagnetic wave detector of any one of the first to eleventh embodiments, and may be prepared as electromagnetic wave detectors having different detection wavelength selectivities. In this case, the electromagnetic wave detector assembly can detect the electromagnetic waves of at least two different wavelengths.

Electromagnetic wave detectors 200, 201, 202, 203 having different detection wavelengths are arrayed in the array in this manner, so that the wavelength of the electromagnetic wave can be identified in an arbitrary wavelength region such as a wavelength region of ultraviolet light, infrared light, a terahertz wave, or a radio wave similarly to the image sensor used in the visible light region. As a result, for example, a colored image in which a difference in the wavelength is indicated as a difference in the color can be obtained.

In addition, a semiconductor material having a different detection wavelength may be used as the constituent material of semiconductor layer 4 constituting the electromagnetic wave detector. For example, the semiconductor material in which the detection wavelength is the wavelength of the visible light and the semiconductor material in which the detection wavelength is the wavelength of the infrared light may be used as the above constituent materials. In this case, for example, when the electromagnetic wave detector is applied to an in-vehicle sensor, the electromagnetic wave detector can be used as a visible light image camera in the daytime. Furthermore, the electromagnetic wave detector can also be used as an infrared camera at night. In this way, the camera having the image sensor need not to be selectively used depending on the detection wavelength of the electromagnetic wave.

As an application of the electromagnetic wave detector other than the image sensor, for example, the electromagnetic wave detector can be used as a position detecting sensor capable of detecting the position of an object even with a small number of pixels. For example, the image sensor that detects intensity of the electromagnetic waves having a plurality of wavelengths can be obtained using electromagnetic wave detectors 200, 201, 202, 203 having the different detection wavelengths as described above due to the structure of the electromagnetic wave detector assembly. Thus, the electromagnetic waves of the plurality of wavelengths can be detected to obtain the color image without no use of a color filter conventionally required in a CMOS image sensor or the like.

Furthermore, a polarization identification image sensor can also be formed by arraying electromagnetic wave detectors 200, 201, 202, 203 having different detected polarizations. For example, polarization imaging can be performed by arranging the plurality of electromagnetic wave detectors in one unit of four pixels in which detected polarization angles are 0°, 90°, 45°, 135°. For example, the polarization identification image sensor enables identification of an artifact and a natural object, material identification, identification of an object having the same temperature in an infrared wavelength range, identification of a boundary between objects, or improvement of equivalent resolution.

As described above, electromagnetic wave detector assembly 2000 can detect the electromagnetic wave having the wide wavelength range. Furthermore, electromagnetic wave detector assembly 2000 can detect the electromagnetic waves having different wavelengths.

Modification

In each of the embodiments described above, a material in which the characteristic is changed by the irradiation with the electromagnetic wave to give the change in potential to two-dimensional material layer 1 is preferably used as the material of insulating film 3, contact layer 8, or first semiconductor portion 4*a* and second semiconductor portion 4*b*.

At this point, for example, quantum dots, ferroelectric materials, liquid crystal materials, fullerenes, rare earth oxides, semiconductor materials, pn junction materials, metal-semiconductor junction materials, and metal-insulator-semiconductor junction materials can be used as the material in which the characteristic is changed by the irradiation with the electromagnetic wave to give the change in potential to two-dimensional material layer 1. For example, when the ferroelectric material having the polarization effect (pyroelectric effect) due to the electromagnetic wave is used as the ferroelectric material, the polarization of the ferroelectric material is changed by the irradiation with the electromagnetic wave. As a result, the change in potential can be applied to two-dimensional material layer 1.

As described above, when the material constituting insulating film 3, contact layer 8, first semiconductor portion 4*a*, or second semiconductor portion 4b is the material in which the characteristic is changed by the irradiation with the electromagnetic wave, the characteristic can be changed by the irradiation with the electromagnetic wave to give the change in potential to two-dimensional material layer 1 in insulating film 3, contact layer 8, first semiconductor portion 4a, or second semiconductor portion 4b.

The material in which the characteristic is changed by the irradiation with the electromagnetic wave to give the change in potential to two-dimensional material layer 1 is applied to insulating film 3, contact layer 8, first semiconductor portion 4a, or second semiconductor portion 4b has been described as the example. However, a material in which the characteristic is changed by the irradiation with the electromagnetic wave to give the change in potential to two-dimensional material layer 1 may be applied to at least one of the above-described members. For example, when the material in which the characteristic is changed by the irradiation with the electromagnetic wave to give the change in potential to two-dimensional material layer 1 is applied to contact layer 8, contact layer 8 is not necessarily in direct contact with two-dimensional material layer 1. For example, as long as the change in potential can be applied to two-dimensional material layer 1, contact layer 8 may be provided on the upper surface or the lower surface of two-dimensional material layer 1 with the insulating film or the like interposed therebetween.

The above-described embodiments can be appropriately modified or omitted. Furthermore, the above-described embodiments can be variously modified without departing from the gist thereof in the implementation stage. In addition, the above-described embodiments include the disclosure of various stages, and various disclosures can be extracted by an appropriate combination of a plurality of disclosed constituent elements.

It should be considered that the disclosed embodiments are an example in all respects and not restrictive. As long as there is no contradiction, at least two of the disclosed embodiments may be combined. The scope of the present disclosure is defined by not the above description but the claims, and it is intended that all modifications within the meaning and scope of the claims are included in the present invention.

REFERENCE SIGNS LIST

1: two-dimensional material layer, 1a, 1b, 1c, 1d: region, 1e: turbulent structure portion, 2a: first electrode, 2b: second electrode, 2c: third electrode, 2c: electrode, 2d: connection conductor, 3: insulation film, 3a: opening, 3b: tapered portion, 4: semiconductor layer, 4a: first semiconductor portion, 4a1: first portion, 4a2: second portion, 4ab, 4ab1, 4ab2: junction interface, 4b, ba: second semiconductor portion, 4ba, 4bc: junction portion, 4c: semiconductor portion, 5: current cutoff mechanism, 6: buffer layer, 7: conductor, 8: contact layer, 40: step, 41, 41a, 41b: bottom, 42: side portion, 43, 43a, 43b: top, 44: back surface, 100, 200, 201, 202, 203: electromagnetic wave detector, 1000, 2000: electromagnetic wave detector assembly

The invention claimed is:

1. An electromagnetic wave detector comprising:
  a semiconductor layer in which at least one step is formed, the semiconductor layer having sensitivity to a detection wavelength;
  an insulating film disposed on the at least one step and provided with at least one opening through which a part of the at least one step is exposed;
  a two-dimensional material layer disposed on the insulating film and the at least one opening, the two-dimensional material layer including a region connected to the semiconductor via the insulating film to generate photogating effect and a connection region electrically connected to the semiconductor layer in the at least one opening;
  a first electrode disposed on the insulating film and electrically connected to the two-dimensional material layer at a position away from the at least one opening; and
  a second electrode disposed on the semiconductor layer and electrically connected to the first electrode through the connection region of the two-dimensional material layer.

2. The electromagnetic wave detector according to claim 1, wherein
  each of the at least one step includes a top, a bottom, and a side portion disposed between the bottom and the top, and
  the at least one opening is provided so as to expose at least a part of the top, the bottom, and the side portion.

3. The electromagnetic wave detector according to claim 1, wherein
  the at least one opening includes a plurality of openings, and
  each of the plurality of openings is provided so as to expose a part of one step of the at least one step.

4. The electromagnetic wave detector according to claim 1, wherein
  the at least one step portion includes a plurality of steps, and
  the at least one opening is provided so as to expose at least a part of the plurality of steps.

5. The electromagnetic wave detector according to claim 1, wherein the semiconductor layer includes a current interruption structure located in a region facing the insulating film and disposed so as to surround an outer periphery of the at least one opening.

6. The electromagnetic wave detector according to claim 1, further comprising a buffer layer disposed between the semiconductor layer and the connection region of the two-dimensional material layer inside the at least one opening.

7. The electromagnetic wave detector according to claim 6, wherein the buffer layer has a thickness capable of forming a tunneling current between the connection region of the two-dimensional material layer and the semiconductor layer.

8. The electromagnetic wave detector according to claim 1, further comprising a connection conductor disposed between the semiconductor layer and the connection region of the two-dimensional material layer inside the at least one opening.

9. The electromagnetic wave detector according to claim 1, wherein
  the two-dimensional material layer further includes an electrode connection region electrically connected to the first electrode, and
  a minimum value of a width of the connection region in a direction intersecting a direction in which the connection region and the electrode connection region are arranged side by side is narrower than a minimum value of a width of the electrode connection region.

10. The electromagnetic wave detector according to claim 9, wherein the width of the connection region in the intersecting direction gradually narrows as a distance from the electrode connection region in the arrangement direction increases.

11. The electromagnetic wave detector according to claim 1, wherein
the semiconductor layer includes:
a first semiconductor portion having a first conductivity type; and
a second semiconductor portion joined to the first semiconductor portion and having a second conductivity type, and
inside the at least one opening, a part of a junction portion between the first semiconductor portion and the second semiconductor portion, and a part of the first semiconductor portion and a part of the second semiconductor portion that are continuous with the junction portion are disposed so as to face the connection region of the two-dimensional material layer.

12. The electromagnetic wave detector according to claim 11, wherein
the first electrode is directly connected to the first semiconductor portion, and
the second electrode is directly connected to the second semiconductor portion.

13. The electromagnetic wave detector according to claim 11, wherein
the first semiconductor portion includes a first portion and a second portion that sandwich at least a part of the second semiconductor portion when the semiconductor layer is viewed from the at least one opening, and
inside the at least one opening, at least a part of the second semiconductor portion, the first portion of the first semiconductor portion, and the second portion of the first semiconductor portion are disposed so as to face the connection region of the two-dimensional material layer.

14. The electromagnetic wave detector according to claim 11, wherein
the connection region of the two-dimensional material layer includes a first connection region in contact with the first semiconductor portion and a second connection region in contact with the second semiconductor portion,
the two-dimensional material layer includes a first two-dimensional material layer including the first connection region and a second two-dimensional material layer including the second connection region, and the first two-dimensional material layer and the second two-dimensional material layer are divided on the junction portion between the first semiconductor portion and the second semiconductor portion.

15. The electromagnetic wave detector according to claim 1, wherein
the semiconductor layer includes:
a first semiconductor portion having a first conductivity type; and
a second semiconductor portion joined to the first semiconductor portion and having a second conductivity type,
the first semiconductor portion is connected to the connection region of the two-dimensional material layer inside the at least one opening, and
the second semiconductor portion is embedded below the first semiconductor portion connected to the connection region of the two-dimensional material layer inside the at least one opening.

16. The electromagnetic wave detector according to claim 1, wherein a thickness of the insulating film changes from the first electrode toward the at least one opening.

17. The electromagnetic wave detector according to claim 1, further comprising at least one conductor or contact layer that is disposed so as to be in contact with the two-dimensional material layer.

18. The electromagnetic wave detector according to claim 1, wherein the two-dimensional material layer includes any material selected from the group consisting of transition metal dichalcogenide, graphene, black phosphorus, silicene, germanene, graphene nanoribbon, and borophene.

19. The electromagnetic wave detector according to claim 1, wherein
the two-dimensional material layer includes at least one layer of graphene provided in a turbostratic structure, and
the at least one layer of graphene provided in the turbostratic structure is provided on a portion located between the at least one opening of the insulating film and the first electrode.

20. The electromagnetic wave detector according to claim 1, further comprising an insulating protective film disposed so as to cover the two-dimensional material layer.

21. An electromagnetic wave detector assembly comprising a plurality of the electromagnetic wave detectors according to claim 1,
wherein the plurality of electromagnetic wave detectors are arranged along at least one of a first direction and a second direction.

* * * * *